US008610465B2

(12) United States Patent
Jansson

(10) Patent No.: US 8,610,465 B2
(45) Date of Patent: Dec. 17, 2013

(54) COMPARATOR CIRCUIT

(75) Inventor: Christer Jansson, Linkoping (SE)

(73) Assignee: CSR Technology Inc., Sunnyvale, CA (US)

( * ) Notice: Subject to any disclaimer, the term of this patent is extended or adjusted under 35 U.S.C. 154(b) by 234 days.

(21) Appl. No.: 12/993,145

(22) PCT Filed: May 25, 2009

(86) PCT No.: PCT/EP2009/056330
§ 371 (c)(1),
(2), (4) Date: May 10, 2011

(87) PCT Pub. No.: WO2009/141457
PCT Pub. Date: Nov. 26, 2009

(65) Prior Publication Data
US 2011/0204978 A1    Aug. 25, 2011

Related U.S. Application Data

(60) Provisional application No. 61/057,980, filed on Jun. 2, 2008.

(30) Foreign Application Priority Data

May 23, 2008 (EP) .................................... 08156868

(51) Int. Cl.
*H03K 5/22* (2006.01)
(52) U.S. Cl.
USPC .............................................. 327/63; 330/9
(58) Field of Classification Search
USPC ........... 327/50, 52–56, 63–71, 306, 307, 551, 327/553, 554; 330/9, 253
See application file for complete search history.

(56) References Cited

U.S. PATENT DOCUMENTS

| 4,962,323 | A |   | 10/1990 | Ta |
| 6,140,872 | A |   | 10/2000 | McEldowney |
| 6,750,704 | B1 |   | 6/2004 | Connell et al. |
| 7,276,970 | B2 | * | 10/2007 | Khorramabadi ............... 330/253 |
| 2005/0116777 | A1 |   | 6/2005 | Bogner |
| 2007/0200620 | A1 |   | 8/2007 | Iriguchi |

OTHER PUBLICATIONS

International Search Report from corresponding International Application No. PCT/EP2009/056330 mailed Sep. 24, 2009.

* cited by examiner

*Primary Examiner* — Lincoln Donovan
*Assistant Examiner* — Diana J Cheng
(74) *Attorney, Agent, or Firm* — Lando & Anastasi, LLP

(57) ABSTRACT

A comparator circuit (5) comprising a fully differential main amplifier unit (10, 10b). The main amplifier unit (10, 10b) comprises a control port and is adapted to control a bias current of a first branch of the main amplifier unit (10, 10b) and/or a bias current of a second branch of the main amplifier unit (10, 10b) in response to one or more control voltages supplied to the control port of the main amplifier unit (10, 10b). The comparator circuit (5) comprises circuitry (60) for balancing the voltages at the positive and negative input terminals (12a, 12b) of the main amplifier unit (10, 10b) during a first clock phase of the comparator circuit (5). Furthermore, the comparator circuit (10, 10a) comprises a switched-capacitor accumulator unit with a differential input. The switched-capacitor accumulator unit is operatively connected to the positive and negative output terminals (14a, 14b) of the main amplifier unit (10, 10b) for sampling voltages at the positive and negative output terminals (14a, 14b) of the main amplifier unit (10, 10b) during the first clock phase, and operatively connected to the control port of the main amplifier unit (10, 10b) for supplying said one or more control voltages.

16 Claims, 9 Drawing Sheets

COMPARATOR CIRCUIT

TECHNICAL FIELD

The present invention relates to a comparator circuit.

BACKGROUND

Comparator circuits are used in electronic circuits e.g. to compare a first and a second voltage to determine which one of the first and the second voltage is the largest. For example, in an analog-to-digital converter (ADC), one or more comparator circuits may be used to compare an analog input voltage, or a voltage derived therefrom, with one or more reference-voltage levels in order to generate a digital output value corresponding to the analog input voltage.

Offset-errors are present in comparator circuits, e.g. due to mismatch between components, such as transistors, in the comparator circuits. A process known as auto zeroing may be used to compensate for the offset-errors. For example, a first switch (e.g. MOS transistor) may be connected between the positive input terminal and the negative output terminal of a fully differential comparator circuit. In addition, a second switch may be connected between the negative input terminal and the positive output terminal of the comparator circuit. The first and second switches are closed during an auto-zero phase to compensate for the offset error by providing a negative feedback loop. To obtain high gain, two or more comparator circuits may be connected in cascade in a comparator arrangement, where the output terminals of a comparator circuit are operatively connected to the input terminals of a succeeding comparator circuit via capacitors. Such a comparator arrangement is e.g. disclosed in the background section of U.S. Pat. No. 4,962,323.

In order to obtain relatively efficient and fast offset-error compensation with the arrangement describe above, it is required that the on resistances of the first and the second switch are relatively low. Therefore, the switches need to be implemented with relatively wide transistors. As a consequence, the first and the second switch provide a relatively high parasitic capacitive load to the comparator circuit, which may limit the bandwidth of the comparator circuit. In addition, the capacitors connected between comparator circuits may also be a limiting factor for the bandwidth. In an ADC, such a bandwidth limitation in a comparator circuit may limit the maximum sampling frequency of the ADC.

Hence there is a need for an offset-error compensated comparator circuit with improved bandwidth.

SUMMARY

Accordingly, an object of the present invention is to mitigate, alleviate or eliminate one or more of the above-identified deficiencies and disadvantages.

According to a first aspect, a comparator circuit is provided. The comparator circuit comprises a fully differential main amplifier unit having a positive input terminal and a negative input terminal for receiving a differential input signal of the comparator circuit, and a positive output terminal, associated with a first branch of the main amplifier unit, and a negative output terminal, associated with a second branch of the main amplifier unit, for outputting a differential output signal of the comparator circuit. The main amplifier unit comprises a control port and is adapted to control a bias current of the first branch of the main amplifier unit and/or a bias current of the second branch of the main amplifier unit in response to one or more control voltages supplied to the control port of the main amplifier unit. Furthermore, the comparator circuit comprises circuitry for balancing the voltages at the positive and negative input terminals of the main amplifier unit during a first clock phase of the comparator circuit. Moreover, the comparator circuit comprises a switched-capacitor accumulator unit with a differential input. The switched-capacitor accumulator unit is operatively connected to the positive and negative output terminals of the main amplifier unit for sampling voltages at the positive and negative output terminals of the main amplifier unit during the first clock phase. Furthermore, the switched-capacitor accumulator unit is operatively connected to the control port of the main amplifier unit for supplying said one or more control voltages.

The control port of the main amplifier unit may comprise a first and a second control terminal. The switched-capacitor accumulator unit may have a first output terminal operatively connected to the first control terminal of the main amplifier unit and a second output terminal operatively connected to the second control terminal.

The main amplifier unit may comprise a differential input-transistor pair comprising a first and a second input transistor. The first input transistor may be arranged in the second branch of the main amplifier unit and connected to the positive input terminal of the main amplifier unit with its gate terminal. The second input transistor may be arranged in the first branch of the main amplifier unit and connected to the negative input terminal of the main amplifier unit with its gate terminal. Furthermore, the main amplifier unit may comprise a differential control-transistor pair. The control-transistor pair may comprise a first control transistor connected to the first control terminal of the main amplifier unit with its gate terminal and operatively connected to one of the first and second branches of the main amplifier unit for controlling a bias current of said one of the first and the second branches of the main amplifier unit. Moreover, the control transistor pair may comprise a second control transistor connected to the second control terminal of the main amplifier unit with its gate terminal and operatively connected to the other one of the first and second branches of the main amplifier unit for controlling a bias current of said other one of the first and the second branches of the main amplifier unit. The differential control-transistor pair may be arranged to receive a control current at a common node of the first control transistor and the second control transistor.

The switched capacitor accumulator unit may comprise a regulator amplifier unit having a positive input terminal, a negative input terminal, a positive output terminal operatively connected to the first control terminal of the main amplifier unit, and a negative output terminal operatively connected to the second control terminal of the main amplifier unit. Furthermore, the switched-capacitor accumulator unit may comprise a first, second, third, and fourth capacitor. The first capacitor may be operatively connected between the positive input terminal and the negative output terminal of the regulator amplifier unit. The second capacitor may be operatively connected between the negative input terminal and the positive output terminal of the regulator amplifier unit. The third capacitor may be operatively connected to a reference voltage node at a first terminal of the third capacitor. The fourth capacitor may be operatively connected to the reference voltage node at a first terminal of the fourth capacitor. Moreover, the switched-capacitor accumulator unit may comprise a first, second, third, and fourth switch device. The first switch device may be operatively connected between the positive output terminal of the main amplifier unit and a second terminal of the third capacitor. The second switch device may be operatively connected between the negative output terminal of the main amplifier unit and a second terminal of the fourth capacitor. The third switch device may be operatively connected between the positive input terminal of the regulator amplifier unit and the second terminal of the third capacitor. The fourth switch device may be operatively connected between the negative input terminal of the regulator amplifier unit and the second terminal of the fourth capacitor. The first and second switch devices may be arranged to be closed during the first clock phase and open during a second clock phase, wherein the first clock phase and the second clock phase do not overlap. Furthermore, the third and fourth switch devices may be arranged to be closed during the second clock phase and open during the first clock phase.

The main amplifier unit may comprise a first load transistor in the second branch of the main amplifier unit and a second load transistor in the first branch of the main amplifier unit. Furthermore, the main amplifier unit may comprise a common-mode control terminal for receiving a common-mode control current for controlling a common-mode output voltage of the main amplifier unit. Moreover, the main amplifier unit may comprise a first current-mirror input transistor operatively connected to the common-mode control terminal for receiving the common-mode control current, and arranged in a current-mirror configuration with the first and second load transistors of the main amplifier unit. The regulator amplifier unit may comprise a current-source unit having an output terminal for outputting a current. Furthermore, the regulator amplifier unit may comprise a common-mode control transistor operatively connected to the output terminal of the current-source unit, arranged to be biased with a common-mode reference voltage at its gate terminal, and operatively connected to the common-mode control terminal of the main amplifier unit for supplying the common-mode control current. Moreover, the regulator amplifier unit may comprise a differential transistor pair operatively connected to the output terminal of the current-source unit. The differential transistor pair may comprise a first input transistor in a first branch of the regulator amplifier unit and a second input transistor in a second branch of the regulator amplifier unit. The first input transistor of the regulator amplifier unit may be operatively connected to the positive input terminal of the regulator amplifier unit with its gate terminal. Similarly, the second input transistor of the regulator amplifier unit may be operatively connected to the negative input terminal of the regulator amplifier unit with its gate terminal.

The regulator amplifier unit may comprise a first load transistor in the first branch of the regulator amplifier unit and a second load transistor in the second branch of the regulator amplifier unit. The gate terminals of the first and second load transistors of the regulator amplifier unit may be interconnected and one of the first and second load transistors of the regulator amplifier unit may be diode connected.

The main amplifier unit may comprise a current-source unit operatively connected to the common node of the differential control-transistor pair of the main amplifier unit for supplying the control current to the differential control-transistor pair of the main amplifier unit. The first control transistor of the differential control-transistor pair of the main amplifier unit may be connected to the second branch of the main amplifier unit with its drain terminal. Similarly, the second control transistor of the differential control-transistor pair of the main amplifier unit may be connected to the first branch of the main amplifier unit with its drain terminal.

The regulator amplifier unit may comprise a transistor operatively connected to the output terminal of the current-source unit of the regulator amplifier unit. Said transistor may be arranged to be biased with the common-mode reference voltage at its gate terminal, and operatively connected to the common node of the differential control-transistor pair of the main amplifier unit for supplying the control current.

The main amplifier unit may comprise a third load transistor in parallel with the first load transistor of the main amplifier unit. Furthermore, the main amplifier unit may comprise a fourth load transistor in parallel with the second load transistor of the main amplifier unit. Moreover, the main amplifier unit may comprise a second and a third current-mirror input transistor. The second current-mirror input transistor may be operatively connected to the drain terminal of the first control transistor of the differential control-transistor pair of the main amplifier unit and arranged in a current-mirror configuration with the third load transistor of the main amplifier unit. Similarly, the third current-mirror input transistor may be operatively connected to the drain terminal of the second control transistor of the differential control-transistor pair of the main amplifier unit and arranged in a current-mirror configuration with the third load transistor of the main amplifier unit.

It is an advantage of embodiments of the comparator circuit that an improved bandwidth is facilitated.

According to a second aspect, an analog-to-digital converter comprises the comparator circuit according to the first aspect.

According to a third aspect, an integrated circuit comprises the comparator circuit according to the first aspect.

According to a fourth aspect, an electronic apparatus comprises the comparator circuit according to the first aspect. The electronic apparatus may e.g. be, but is not limited to, any of a liquid-crystal display, a computer monitor, a digital camera, a projector, and a radio receiver.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of the invention will appear from the following detailed description of the invention, reference being made to the accompanying drawings, in which.

DETAILED DESCRIPTION

Figure 1:
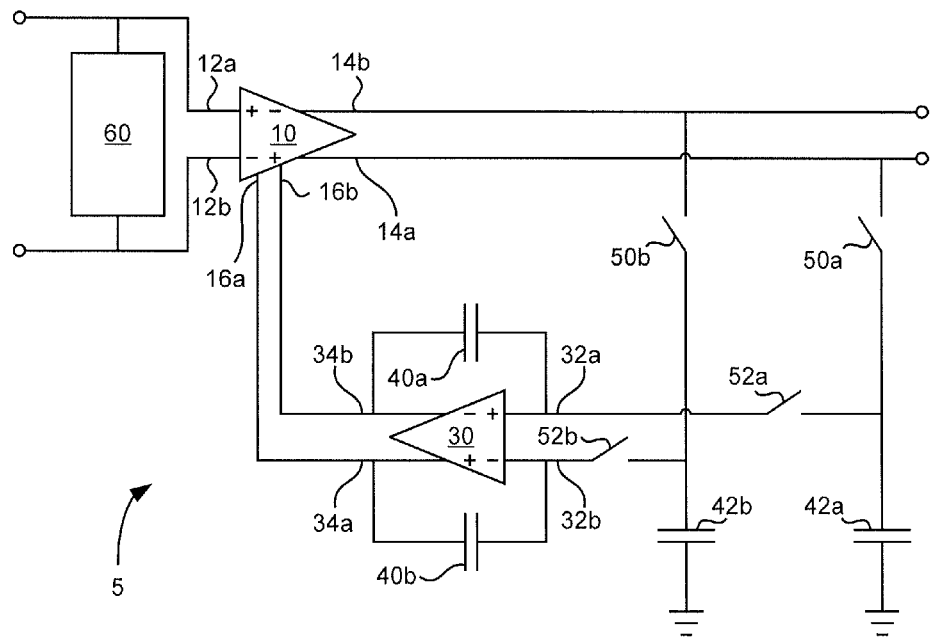
FIGS. 1-2 are circuit diagrams of a comparator circuit according to embodiments.
Figure 2:
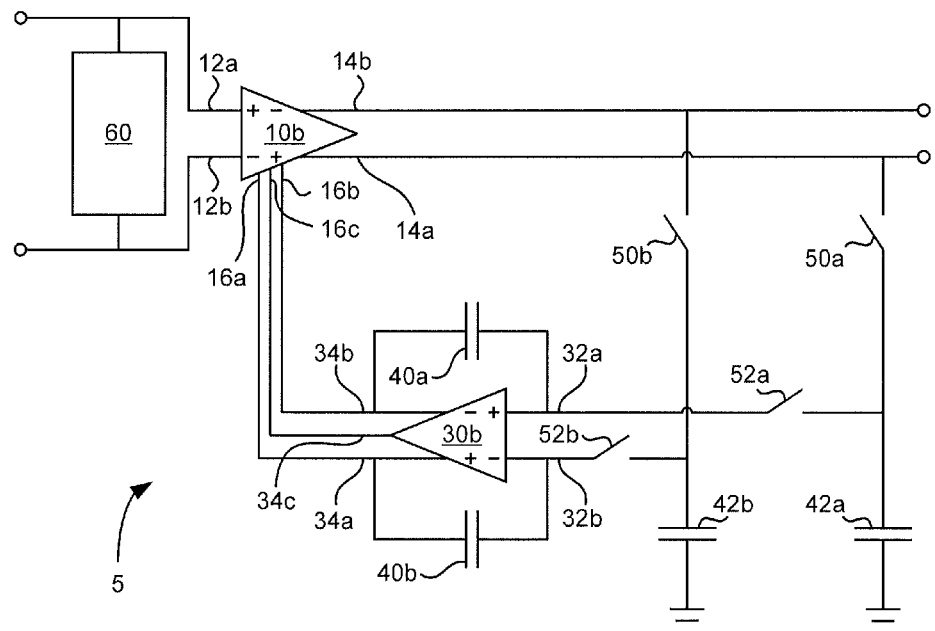

FIG. 1 is a circuit diagram of a comparator circuit 5 according to an embodiment. The comparator circuit 5, according to the embodiment, comprises a fully differential main amplifier unit 10. The main amplifier unit 10 has a positive input terminal 12a and a negative input terminal 12b for receiving a differential input signal of the comparator circuit 5. Furthermore, the main amplifier unit 10 has a positive output terminal 14a and a negative output terminal 14b for outputting a differential output signal of the comparator circuit 5. The positive output terminal 14a is associated with a first branch of the main amplifier unit 10, and the negative output terminal 14b is associated with a second branch of the main amplifier unit 10, as will be further elucidated with detailed embodiments of the main amplifier unit 10 and 10b (FIG. 2).

The main amplifier unit 10 comprises a first control terminal 16a and a second control terminal 16b. Furthermore, the main amplifier unit 10 is adapted to control a bias current of its first branch and a bias current of its second branch in response to control voltages applied to the first and second control terminal 16a, 16b of the main amplifier unit 10. By means of applying appropriate control voltages, said bias currents may be tuned, or controlled, to reduce or eliminate an offset-error of the main amplifier unit 10. Examples on how said bias currents may be tuned or controlled will be given in the context of detailed embodiments of the main amplifier unit 10 and 10b (FIG. 2).

According to the embodiment illustrated in FIG. 1, the comparator circuit 5 further comprises a fully differential switched-capacitor (SC) accumulator unit operatively connected to the positive and negative output terminals 14a, 14b of the main amplifier unit. The SC accumulator unit is arranged to sample voltages at the positive and negative output terminals 14a, 14b of the main amplifier unit 10 during a first clock phase of the comparator circuit 5. This first clock phase will in this specification be referred to as an "auto-zero phase". Furthermore, the SC accumulator unit is operatively connected to the first and second control terminals 16a, 16b of the main amplifier unit 10, for applying the control voltages to these terminals.

In the embodiment shown in FIG. 1, the SC accumulator comprises a fully differential regulator amplifier unit 30 having a positive input terminal 32a, a negative input terminal 32b, a positive output terminal 34a, and a negative output terminal 34b. The positive output terminal 34a is operatively connected to the first control terminal 16a of the main amplifier unit 10. The negative output terminal 34b is operatively connected to the second control terminal 16b of the main amplifier unit 10.

Furthermore, the SC accumulator unit comprises capacitors 40a, 40b, 42a, and 42b. The capacitor 40a is operatively connected between the positive input terminal 32a and the negative output terminal 34b of the regulator amplifier unit 30. The capacitor 40b is operatively connected between the negative input terminal 32b and the positive output terminal 34a of the regulator amplifier unit 30. Moreover, the capacitor 42a is operatively connected to a reference voltage node at a first terminal of the capacitor 42a. In FIG. 1, the reference voltage node is a ground node. However, other reference voltages than ground may be used as well. The capacitor 42b is operatively connected to the reference voltage node at a first terminal of the capacitor 42b.

According to some embodiments, the capacitors 40a and 40b may be designed to have equal capacitances and the capacitors 42a and 42b may be designed to have equal capacitances. Due to e.g. random variations in the manufacturing process, the properties of components that have been designed to be equal are, in practice, usually slightly different. This is commonly referred to as matching errors. Hence, the capacitances of the capacitors 40a and 40b may be slightly different although they have been designed to have equal capacitances. Similarly, the capacitances of the capacitors 42a and 42b may be slightly different although they have been designed to have equal capacitance. According to other embodiments, the capacitors 40a and 40b may be designed to have different capacitances. Similarly, the capacitors 42a and 42b may be designed to have different capacitances. For example, the capacitor 40a may be designed for a capacitance $C_0$ and the capacitor 40b may be designed for a capacitance $K \cdot C_0$, where K is a real-valued scaling factor. Then, the capacitor 42a may be designed for a capacitance $C_2$ and the capacitor 42b may be designed for a capacitance $K \cdot C_2$. In the remainder of this specification, it is assumed that capacitors 40a and 40b have equal capacitance and that capacitors 42a and 42b have equal capacitance, although other alternatives are possible.

In addition, the SC accumulator unit illustrated in FIG. 1 comprises switch devices 50a, 50b, 52a, and 52b. These switch devices may e.g. be implemented with transistors, such as but not limited to MOS transistors. According to some embodiments, one or more of the switch devices 50a, 50b, 52a, and 52b may be implemented with one or more NMOS transistors in parallel. According to some embodiments, one or more of the switch devices 50a, 50b, 52a, and 52b may be implemented with one or more PMOS transistors parallel. According to some embodiments, one or more of the switch devices 50a, 50b, 52a, and 52b may be implemented with a transmission gate. The transmission gate may e.g. comprise an NMOS transistor connected in parallel with a PMOS transistor, where the PMOS transistor may be arranged to be controlled with the inverse of a signal controlling the NMOS transistor.

The switch device 50a is operatively connected between the positive output terminal 14a of the main amplifier unit 10 and a second terminal of the capacitor 42a. The switch device 52a is operatively connected between the positive input terminal 32a of the regulator amplifier unit 30 and the second terminal of the capacitor 42a. The switch device 50b is operatively connected between the negative output terminal 14b of the main amplifier unit 10 and a second terminal of the capacitor 42b. The switch device 52b is operatively connected between the negative input terminal 32b of the regulator amplifier unit 30 and the second terminal of the capacitor 42b.

During the auto-zero phase, the input voltages of the comparator circuit 5, at the input terminals 12a and 12b of the main amplifier unit 10, may be balanced e.g. by forcing said input voltages to be equal or approximately equal. For example, the comparator circuit 5 may comprise an auto-zero control unit 60, as illustrated in FIG. 1, for that purpose. The auto-zero control unit 60 may e.g. comprise one or more switch devices connected to the positive input terminal 12a and/or the negative input terminal 12b of the main amplifier unit 10, as will be further described in the context of FIGS. 7a and b. Ideally, when the positive and negative input terminals 12a, 12b of the main amplifier unit 10 are set to equal voltages, the voltage difference between the positive and the negative output terminal 14a, 14b of the main amplifier unit 10 is zero. However, if an offset error is present in the main amplifier unit 10, there will be a nonzero offset-error voltage present between the positive and the negative output terminal 14a, 14b of the main amplifier unit 10.

For the embodiment in FIG. 1, the switch devices 50a and 50b are arranged to be closed during the auto-zero phase. Thereby, the offset-error voltage between the positive and the negative output terminal 14a, 14b of the main amplifier unit 10 is sampled on the capacitors 42a and 42b. The offset-error voltage causes a charge difference between the capacitors 42a and 42b. During a second clock phase, which in this specification is referred to as a "compare phase", the switch devices 50a and 50b are arranged to be open.

The devices 52a and 52b are arranged to be open during the auto-zero phase and closed during the compare phase. Thereby, electrical charge is transferred between the capacitors 40a and 42a and between the capacitors 40b and 42b during the compare phase. The charge difference between the capacitors 42a and 42b, which represents the offset-error voltage of the output terminals 14a, 14b of the main amplifier unit 10 sampled during the auto-zero phase, is redistributed to and accumulated at the capacitors 42a and 42b during the compare phase.

As an example, the offset error of the main amplifier unit 10 during a certain auto-zero phase may be such that the positive output voltage (i.e. voltage at the positive output terminal 14a) is higher than the negative output voltage (i.e. voltage at the negative output terminal). Then, the charge at the capacitor 42a will be higher than the charge at the capacitor 42b. The negative feedback configuration of the regulator amplifier unit 30 forces the voltages at the input terminals 32a and 32b of the regulator amplifier unit 30 to be substantially equal (ideally, if the regulator amplifier unit 30 had had infinite gain and no offset error, the voltages at the input terminals 32a and 32b of the regulator amplifier unit 30 would have been exactly equal). As a consequence, the charge transferred to the capacitor 40a during the subsequent compare phase is higher than the corresponding charge transferred to the capacitor 40b (taking into account not only the absolute value but also the sign of the transferred charge). Thereby, the differential output voltage $V_A-V_B$ of the regulator amplifier unit 30, where $V_A$ and $V_B$ denotes the voltages at the positive output terminal 34a and the negative output terminal 34b, respectively, will increase for counteracting the offset error of the main amplifier unit 10 sampled during the preceding auto-zero phase.

As another example, the offset error of the main amplifier unit 10 during a certain auto-zero phase may be such that the positive output voltage is lower than the negative output voltage. Then, the charge at the capacitor 42a will be lower than the charge at the capacitor 42b. As a consequence, the charge transferred to the capacitor 40a during the subsequent compare phase is lower than the corresponding charge transferred to the capacitor 40b. Thereby, the differential output voltage $V_A-V_B$ of the regulator amplifier unit 30 will decrease for counteracting the offset error of the main amplifier unit 10 sampled during the preceding auto-zero phase.

According to embodiments, the SC accumulator unit is arranged as or similar to a discrete-time integrating controller providing a negative feedback of the offset error of the main amplifier unit 10. The offset-error will not be fully compensated during a single auto-zero/compare cycle of the comparator circuit. Instead, the offset error will be gradually reduced for each cycle, ideally approaching zero. If the regulator amplifier unit 30 has an offset error, the offset-error voltage between the output terminals 14a and 14b of the main amplifier unit 10 will gradually approach a value approximately equal to the input-referred offset voltage of the regulator amplifier unit 30. Hence, the input-referred offset voltage of the main amplifier unit 10 will gradually approach a value approximately equal to the input-referred offset voltage of the regulator amplifier unit 30 divided by the gain of the main amplifier unit 10. For example, circuit simulations on transistor level of an embodiment of the comparator circuit 5 have shown that the input referred offset voltage of the main amplifier unit 10, in this embodiment, may settle within 1 mV in 15 auto-zero/compare cycles or less.

The implementation of the SC accumulator unit illustrated in FIG. 1 is only an example. Other implementations of SC accumulators are known in the art and may also be used in embodiments of the present invention.

Due to that the main amplifier unit 10 is fully differential, common-mode control circuitry may be required to control the common-mode level at the output terminals 14a, 14b of the main amplifier unit 10. A separate common-mode feedback loop (not shown in FIG. 1) may be provided for controlling said common-mode level. FIG. 2 illustrates an alternative embodiment of the comparator circuit 5. Similar to the embodiment illustrated in FIG. 1, the embodiment of comparator circuit 5 illustrated in FIG. 2 comprises a main amplifier unit 10b and an SC accumulator unit comprising a regulator amplifier unit 30b. A difference between the embodiments of FIG. 1 and FIG. 2 is that the main amplifier unit 10b in FIG. 2 comprises a common-mode control terminal 16c. According to embodiments, the main amplifier unit 10b is arranged to receive a common-mode control current for controlling the common-mode output voltage of the main amplifier unit 10b at the common-mode control terminal 16c. The regulator amplifier unit 30b may be adapted to provide the common-mode control current to the main amplifier unit 10b. For example, the regulator amplifier unit 30b may have an additional output terminal 34c operatively connected to the common-mode control terminal 16c of the main amplifier unit 10b for supplying the common-mode control current. Thereby, a combined feedback loop for compensating both offset and common-mode variations may be provided.

Figure 3:
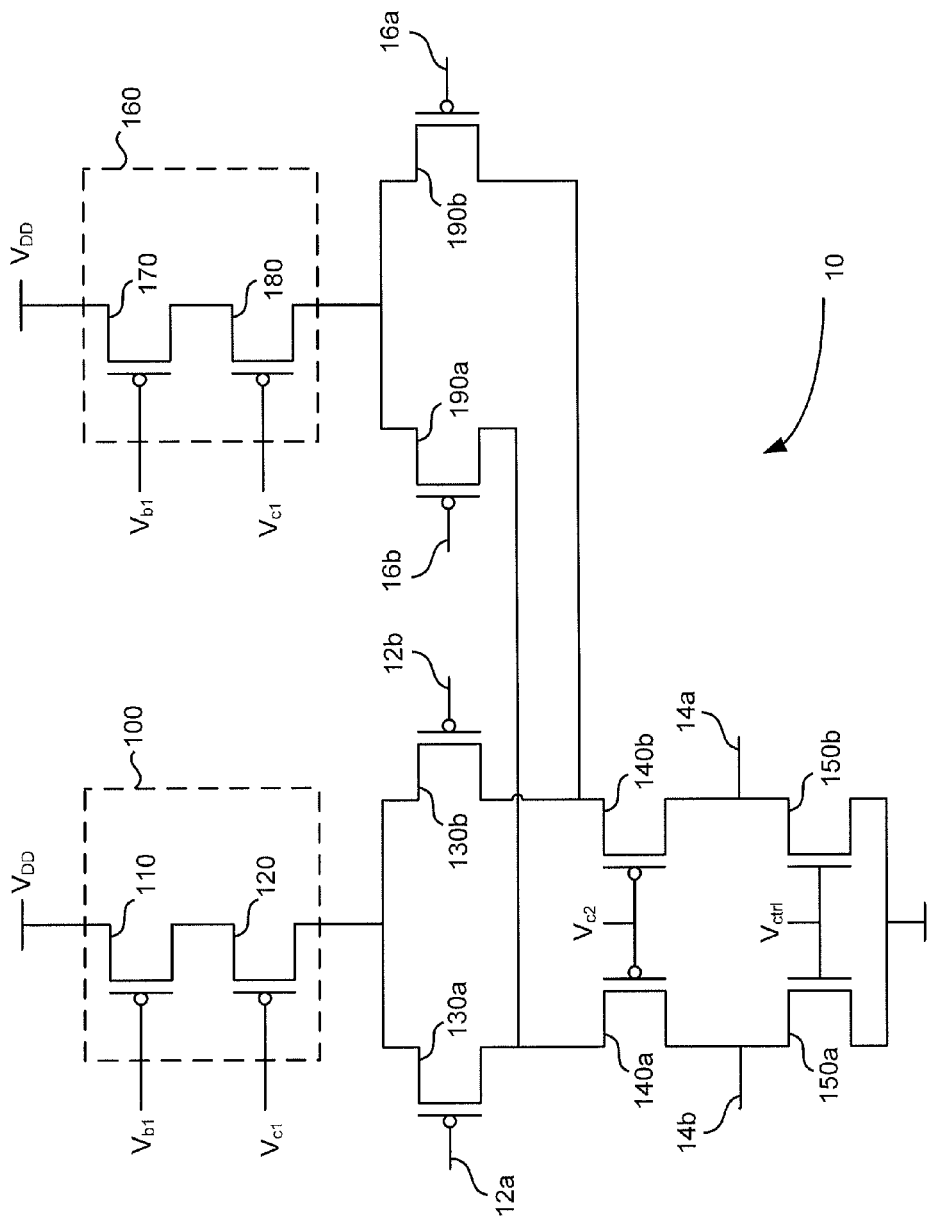
FIGS. 3-4 are circuit diagrams of a main amplifier unit of a comparator circuit according to embodiments.

FIG. 3 is a circuit diagram of the main amplifier unit 10 (FIG. 1) according to an embodiment. According to the embodiment, the main amplifier unit 10 comprises a current-source unit 100 for providing a bias current to the main amplifier unit 10. In FIG. 3, the current-source unit 100 comprises a PMOS transistor 110 which is connected to a supply-voltage node $V_{DD}$ at its source terminal and arranged to be biased with a bias voltage $V_{b1}$ at its gate terminal. In addition, the current-source unit 100 comprises a PMOS cascode transistor 120 arranged to be biased with a bias voltage $V_{c1}$. This embodiment of the current-source unit 100 is only an example. According to other embodiments, the current-source unit 100 may be implemented with a single transistor (e.g. the PMOS transistor 110). According to other embodiments, the current-source unit 100 may comprise more than one cascode transistor. Moreover, the current-source unit 100 may additionally or alternatively comprise other transistors than MOS transistors, e.g. bipolar-junction transistors (BJTs). According to some embodiments, the current-source unit 100 may be implemented with a resistor connected between the $V_{DD}$ node and the source nodes of the transistors 130a and 130b.

According to the embodiment of FIG. 3, the main amplifier unit 10 comprises a differential input-transistor pair. The differential input-transistor pair comprises an input transistor 130b in the first branch of the main amplifier unit 10 (i.e. the branch with which the positive output terminal 14a is associated, which is the right-hand branch in FIG. 3). The input transistor 130b is connected to the negative input terminal 12b of the main amplifier unit 10 with its gate terminal. Furthermore, the differential input-transistor pair comprises an input transistor 130a in the second branch of the main amplifier unit 10 (i.e. the branch with which the negative output terminal 14b is associated, which is the left-hand branch in FIG. 3). The input transistor 130a is connected to the positive input terminal 12a of the main amplifier unit 10 with its gate terminal. In the circuit diagram example in FIG. 3, the input transistors 130a and 130b are PMOS transistors.

Furthermore, the embodiment of the main amplifier unit 10 illustrated in FIG. 3 comprises a cascode transistor 140a in the second branch and a cascode transistor 140b in the first branch. The cascode transistors 140a and 140b are biased with a bias voltage $V_{c2}$ at their gate terminals. According to some embodiments, the cascode transistors 140a and 140b may be omitted. According to other embodiments, each of the first and the second branch may comprise more than one cascode transistor.

Moreover, according to the embodiment illustrated in FIG. 3, the main amplifier unit 10 comprises a load transistor 150a and a load transistor 150b in the second and first branch, respectively. In FIG. 3, the load transistors are implemented with NMOS transistors. However, in other embodiments, other types of transistors, such as BJTs, may be used. The load transistors 150a and 150b are arranged to be controlled with a voltage $V_{ctrl}$ at their gate terminals. The voltage $V_{ctrl}$ may e.g. be provided by a common-mode feedback circuit (not shown).

The embodiment of the main amplifier unit 10 illustrated in FIG. 3 comprises a differential control-transistor pair connected to a current-source unit 160. Similar to the current-source unit 100, the current source unit 160 comprises a PMOS transistor 170 which is connected to the supply-voltage node $V_{DD}$ at its source terminal and arranged to be biased with the bias voltage $V_{b1}$ at its gate terminal and a PMOS cascode transistor 180 arranged to be biased with the bias voltage $V_{c1}$. As for the current-source unit 100, the cascode transistor 180 may be omitted in some embodiments. In other embodiments, the current-source unit 160 may comprise more than one cascode transistor. Other modifications, e.g. as described with reference to the current-source unit 100, may also be made to the current-source unit 160.

The differential control-transistor pair comprises a control transistor 190a connected to the second control terminal 16b of the main amplifier unit 10 with its gate terminal. Furthermore, the control transistor 190a is connected to the second branch of the main amplifier unit 10 for controlling a bias current of the second branch. Moreover, the differential control-transistor pair comprises a control transistor 190b connected to the first control terminal 16a of the main amplifier unit 10 with its gate terminal. The control transistor 190b is connected to the first branch of the main amplifier unit 10 for controlling a bias current of the first branch. In the exemplary circuit diagram shown in FIG. 3, the control transistors 190a and 190b are PMOS transistors. The drain terminals of the PMOS transistors 190a and 190b are connected to the source terminals of the cascode transistors 140a and 140b, respectively. According to other embodiments, the source terminals of the control transistors 190a and 190b may be connected directly to the output terminals 14b and 14a, respectively, of the main amplifier unit 10. An advantage of having the drain terminals of the control transistors 190a, 190b connected to the source terminals of the cascode transistors 140a, 140b is that the cascode transistors 140a, 140b isolates the control transistors 190a, 190b from the output terminals 14a, 14b of the main amplifier unit 10. Thereby, the drain currents of the control transistors 190a and 190b are less dependent on the voltages at the output terminals 14a and 14b than if the source terminals of the control transistors 190a and 190b were connected directly to the output terminals 14b and 14a, respectively, of the main amplifier unit 10. According to some embodiments, the source terminals of the control transistors 190a and 190b may be connected via separate, dedicated cascode transistors (not shown) to the output terminals 14b and 14a, respectively, of the main amplifier unit 10.

According to some embodiments, the transistors associated with the first branch may be designed to have the same size as the corresponding transistors associated with the second branch. For example, transistor 130b may be designed to have the same size as transistor 130a, transistor 140b may be designed to have the same size as the transistor 140a, transistor 150b may be designed to have the same size as the transistor 150a, and transistor 190b may be designed to have the same size as the transistor 190a. According to other embodiments, the transistors associated with the first branch may be designed to have a different width-over-length (W/L) ratio than the corresponding transistors associated with the second branch. For example, each transistor associated with the first branch may have a W/L ratio that is $K_2$ times the corresponding transistor associated with the second branch, where $K_2$ is a real-valued scaling factor. In examples presented in the remainder of this specification, it is assumed that a transistor associated with a first branch of a differential amplifier (e.g. main amplifier unit 10, 10b and regulator amplifier 30, 30b) is designed to have the same size as a corresponding transistor associated with a second branch of the differential. However, embodiments where transistors associated with the first branch are designed to have a different W/L ratio than the corresponding transistors associated with the second branch, e.g. as discussed above, are possible within the scope of the present invention.

Examples on the operation of the comparator circuit 5 will now be described with reference to both FIG. 1 and FIG. 3. If the offset error of the main amplifier unit 10 during a certain auto-zero phase is such that the positive output voltage is higher than the negative output voltage, the differential output voltage $V_A - V_B$ of the regulator amplifier unit 30 will increase during the subsequent compare phase, as described above. As a consequence, the fractions of the current from the current-source unit 160 that are directed via the control transistor 190b and the control transistor 190a decreases and increases, respectively. Hence, in the subsequent auto-zero phase, the differential output voltage $U_A - U_B$, where $U_A$ and $U_B$ denotes the voltages at the positive output terminal 14a and the negative output terminal 14b, respectively, of the main amplifier unit 10, will have decreased.

If the, on the other hand, the offset error of the main amplifier unit 10 during a certain auto-zero phase is such that the negative output voltage is higher than the positive output voltage (i.e. $U_A - U_B$ is negative), the differential output voltage $V_A - V_B$ of the regulator amplifier unit 30 will decrease during the subsequent compare phase, as described above. As a consequence, the fraction of the current from the current-source unit 160 that is directed via the control transistor 190b and the control transistor 190a increases and decreases, respectively. Hence, in the subsequent auto-zero phase, the differential output voltage $U_A - U_B$ of the main amplifier unit 10 will have increased.

Figure 4:
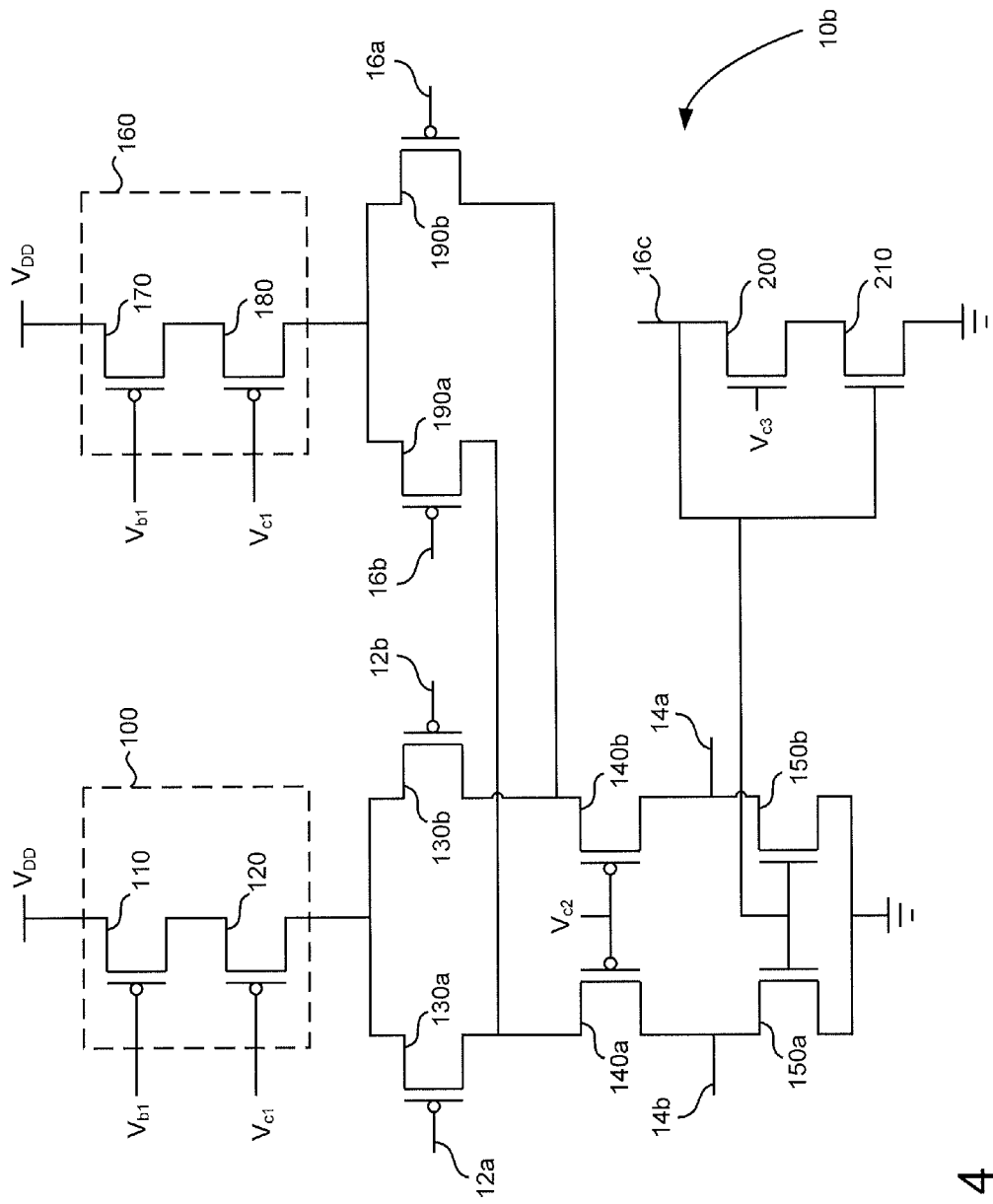

FIG. 4 is a circuit diagram of the main amplifier unit 10b (FIG. 2) according to an embodiment. The embodiment of the main amplifier unit 10b illustrated in FIG. 4 comprises the same circuit elements as the embodiment of the main amplifier unit 10 illustrated in FIG. 3, arranged substantially in the same way. These circuit elements may, in some embodiments, be subject to various rearrangements, additions, and deletions, e.g. as described in the context of FIG. 3. In addition, the embodiment of the main amplifier unit 10b illustrated in FIG. 4 comprises a current-mirror input transistor 210. The current-mirror input transistor is of the same type as the load transistors 150a and 150b. For example, in the exemplary circuit diagram shown in FIG. 4, the transistors 150a, 150b, and 210 are all NMOS transistors. The current-mirror input transistor 210 is operatively connected to the common-mode control terminal 16c for receiving the common-mode control current. Furthermore, the current-source input transistor 210 is arranged in a current-mirror configuration with the first and second load transistors 150a and 150b. If the common-mode control current increases, the gate-to-source voltage ($V_{GS}$) of the current-mirror input transistor 210 increases. Consequently, the $V_{GS}$ of the load transistors 150a and 150b also increases. Thereby, the common-mode output voltage of the main amplifier unit 10b decreases. On the other hand, if the common-mode control current decreases, the $V_{GS}$ of the current-mirror input transistor 210 decreases. Consequently, the $V_{GS}$ of the load transistors 150a and 150b also decreases. Thereby, the common-mode output voltage of the main amplifier unit 10b increases.

According to the embodiment illustrated in FIG. 4, the main amplifier unit 10b comprises an NMOS cascode transistor 200 connected between the drain terminal of the current-mirror input transistor 210 and the common-mode control terminal 16c of the main amplifier unit 10b. According to some embodiments, the cascode transistor 200 may be omitted. For example, the drain terminal of the current-mirror input transistor 210 may be connected directly to the common-mode control terminal 16c.

Figure 5:
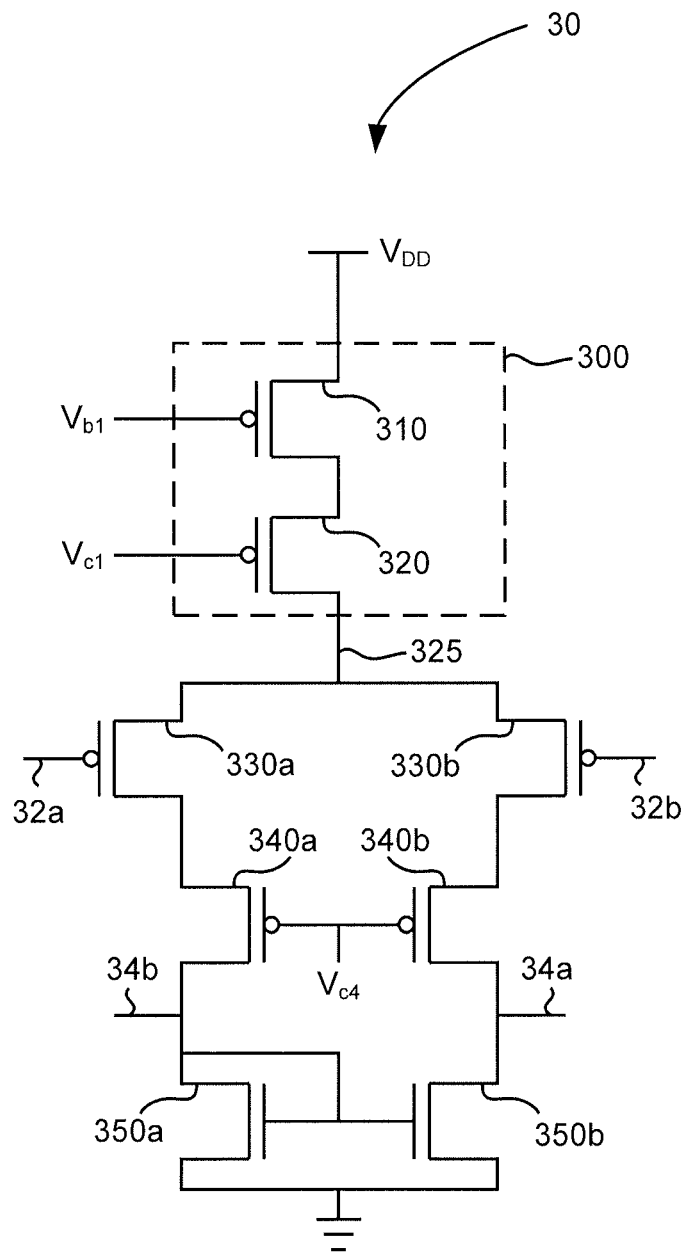
FIGS. 5-6 are circuit diagrams of a regulator amplifier unit of a comparator circuit according to embodiments.

FIG. 5 is a circuit diagram of an embodiment of the regulator amplifier unit 30 (FIG. 1). The embodiment of the regulator amplifier unit 30 illustrated in FIG. 5 is suitable for operation together with the embodiment of the main amplifier unit 10 illustrated in FIG. 3. According to the embodiment of FIG. 5, the regulator amplifier unit 30 comprises a current-source unit 300. The current source unit 300 comprises a PMOS transistor 310 which is connected to the supply-voltage node $V_{DD}$ at its source terminal and arranged to be biased with the bias voltage $V_{b1}$ at its gate terminal, and a PMOS cascode transistor 320 arranged to be biased with the bias voltage $V_{c1}$. As for the current-source units 100 and 160 (FIGS. 3 and 4), the cascode transistor 320 may be omitted in some embodiments. In other embodiments, the current-source unit 300 may comprise more than one cascode transistor. Other modifications, e.g. as described with reference to the current-source unit 100, may also be made to the current-source unit 300. The current-source unit 300 has an output terminal 325 for delivering a bias current to the regulator amplifier unit 30.

Furthermore, according to the embodiment illustrated in FIG. 5, the regulator amplifier unit 30 comprises a differential transistor pair connected to an output terminal 325 of the current-source unit 300. The differential transistor pair comprises an input transistors 330a in a first branch and an input transistor 330b in a second branch. The input transistor 330a is connected to the positive input terminal 32a of the regulator amplifier unit 30 with its gate terminal. Similarly, the input transistor 330b is connected to the negative input terminal 32b of the regulator amplifier unit 30 with its gate terminal. Moreover, the regulator amplifier unit 30 comprises a load transistor 350a in the first branch of the regulator amplifier unit 30 and a load transistor 350b in the second branch of the regulator amplifier unit 30. The drain terminals of the load transistors 350a and 350b are operatively connected to the negative output terminal 34b and the positive output terminal 34a, respectively, of the main amplifier unit 30. The gate terminals of the load transistors 350a and 350b are interconnected. The load transistor 350a is diode connected, i.e. has its gate terminal connected to its drain terminal. According to other embodiments, the load transistor 350b may be diode connected instead. According to other embodiments, neither of the load transistors 350a and 350b is diode connected. Instead, the $V_{GS}$ of the load transistors 350a and 350b may be set with a common-mode feedback circuit (not shown).

The diode-connected load transistor 350a has a relatively small small-signal resistance, e.g. compared with the other load transistor 350b, which is not diode connected. Therefore, provided a varying differential input voltage between the input terminals 32a and 32b, the negative output voltage (i.e. the voltage at the negative output terminal 34b) is relatively stable compared with the positive output voltage (i.e. the voltage at the positive output terminal 34a). That is, the largest fraction of a variation in the differential output voltage between the output terminals 34a and 34b is constituted by a variation in the positive output voltage, whereas a variation in the negative output voltage constitutes the smallest fraction of said variation in the differential output voltage. As a consequence, the common-mode output level of the regulator amplifier unit 30, according to the embodiment in FIG. 5, will vary with a varying differential input voltage of the regulator amplifier unit 30. However, compared with e.g. a circuit solution where neither of the load transistors 350a and 350b is diode connected, the common-mode output voltage variation of the embodiment of the regulator amplifier unit 30 in FIG. 5 is a relatively well-defined function of the differential input voltage. Therefore, having one of the load transistors 350a and 350b in a diode-connected configuration may eliminate the need for a common-mode feedback circuit for controlling the common-mode output voltage of the regulator amplifier unit 30.

According to the embodiment illustrated in FIG. 5, the regulator amplifier unit comprises cascode transistors 340a and 340b, biased with a voltage $V_{e4}$, connected between the input transistors 330a and 330b and the output terminals 34a and 34b of the regulator amplifier unit 30. According to some embodiments, the cascode transistors 340a and 340b may be omitted.

In the circuit diagram shown in FIG. 5, the regulator amplifier unit 30 is implemented with MOS transistors. Transistors with high input resistance, such as MOS transistors or other types of field-effect transistors with an insulating layer for isolating the gate terminal, are suitable for use as the input transistors 330a and 330b in order to avoid excessive charge leakage from the capacitors 40a, 40b, 42a, and 42b (FIG. 1 and FIG. 2). The other transistors in the circuit diagram in FIG. 5 may be replaced with other types of transistors, such as BJTs. For example, some or all NMOS transistors may be replaced with NPN transistors and some or all PMOS transistors may be replaced with PNP transistors.

Figure 6:
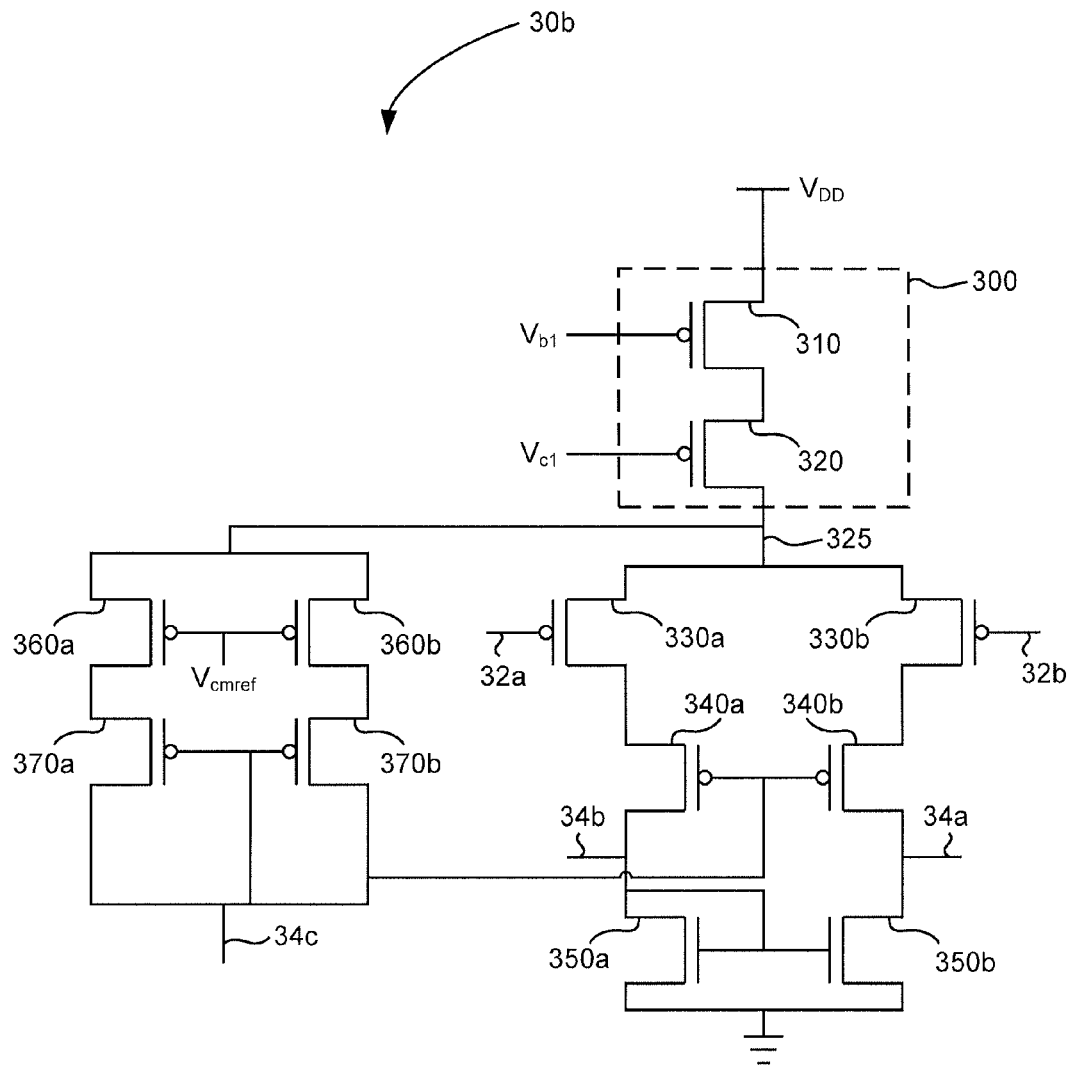

FIG. 6 shows a circuit diagram of the regulator amplifier unit 30b (FIG. 2). This embodiment of the regulator amplifier unit 30b is suitable for operation together with the embodiment of the main amplifier unit 10b illustrated in FIG. 4. The embodiment of the regulator amplifier unit 30b illustrated in FIG. 6 comprises all the circuit elements of the embodiment of the regulator amplifier unit 30 illustrated in FIG. 5. These circuit elements may, in various embodiments, be subject to the same modifications as described above in the context of FIG. 5.

In addition, the regulator amplifier unit 30b, according to the embodiment in FIG. 6, comprises PMOS common-mode control transistors 360a and 360b. Each of the common-mode control transistors 360a and 360b may e.g. be designed to have the same size as each of the input transistors 330a and 330b. The common-mode control transistors 360a and 360b are connected to the output terminal 325 of the current-source unit 300. Furthermore, the common-mode control transistors 360a and 360b are arranged to be biased with a common-mode reference voltage, $V_{cmref}$, at their gate terminals. The drain terminals of the common-mode control transistors 360a and 360b are operatively connected to the output terminal 34c of the regulator amplifier unit 30b for supplying the common-mode control current to the common-mode control terminal 16c of the main amplifier unit 10b. Diode connected PMOS transistors 370a and 370b are connected between the output terminal 34c of the regulator amplifier unit 30b and the drain terminals of the common-mode control transistors 360a and 360b. The gate terminals of the transistors 370a and 370b are arranged to supply a suitable gate voltage to the cascode transistors 340a and 340b.

According to some embodiments, other numbers of common-mode control transistors than two may be used. As a nonlimiting example, the drain terminals of the common-mode control transistors 360a and 360b in FIG. 6 may be shorted, effectively forming a single common-mode control transistor by means of a parallel connection of the common-mode control transistors 360a and 360b.

Common-mode control of the comparator circuit 5 will now be qualitatively described, by means of examples, with reference to FIG. 2, FIG. 4, and FIG. 6. The W/L ratio of each of the transistors 150a and 150b is denoted $S_{150}$. The W/L ratio for the transistor 210 is denoted $S_{210}$. Furthermore, the currents generated by the current-source units 100, 110, and 300 are denoted $I_{100}$, $I_{160}$, and $I_{300}$, respectively. For the examples, the following condition is fulfilled:

$$I_{100}+I_{160}=(S_{150}/S_{210})\cdot I_{300} \qquad \text{Eq. 1}$$

In a first example, the common-mode input voltage at the input terminals 32a and 32b of the regulator amplifier unit 30b is initially equal to $V_{cmref}$. Thereby, approximately half the current $I_{300}$ is directed through the common-mode control transistors 360a and 360b to the common-mode control terminal 16c of the main amplifier unit 16c. Furthermore, in the first example, the common-mode output voltage at the terminals 14a and 14b of the main amplifier unit 10b is initially, during a first auto-zero phase, higher than $V_{cmref}$. When the switch devices 50a and 50b are opened and the switch devices 52a and 52b are closed in the transition to the subsequent compare phase, the common-mode input voltage of the regulator amplifier unit 30b therefore increases. As a consequence, the fraction of the current $I_{300}$ that is directed via the common-mode control transistors 360a and 360b increases. That is, the common-mode control current supplied to the common-mode control terminal 16c of the main amplifier unit 10b increases. Thereby, the $V_{GS}$ of the load transistors 150a and 150b increases, which causes the common-mode output voltage of the main amplifier unit 10b to decrease.

In a second example, the same initial conditions prevail as in the first example, except that the common-mode output voltage of the main amplifier unit 10b is initially lower than $V_{cmref}$ instead of higher than $V_{cmref}$. When the switch devices 50a and 50b are opened and the switch devices 52a and 52b are closed in the transition to the subsequent compare phase, the common-mode input voltage of the regulator amplifier unit 30b therefore decreases. As a consequence, the fraction of the current $I_{300}$ that is directed via the common-mode control transistors 360a and 360b decreases. That is, the common-mode control current supplied to the common-mode control terminal 16c of the main amplifier unit 10b decreases. Thereby, the $V_{GS}$ of the load transistors 150a and 150b decreases, which causes the common-mode output voltage of the main amplifier unit 10b to decrease.

More generally, under the condition of Eq. 1, the common-mode control loop inherent in the circuitry illustrated in FIG. 2, FIG. 4, and FIG. 6 is arranged to gradually drive the common-mode output voltage of the main amplifier unit 10b approximately towards $V_{cmref}$ during consecutive auto-zero/compare cycles.

Figure 7A:
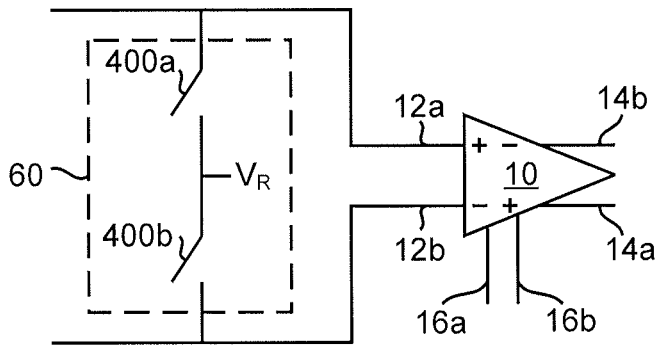
FIGS. 7a and b are circuit diagrams of part of a comparator circuit illustrating embodiments of an auto-zero control unit.
Figure 7B:
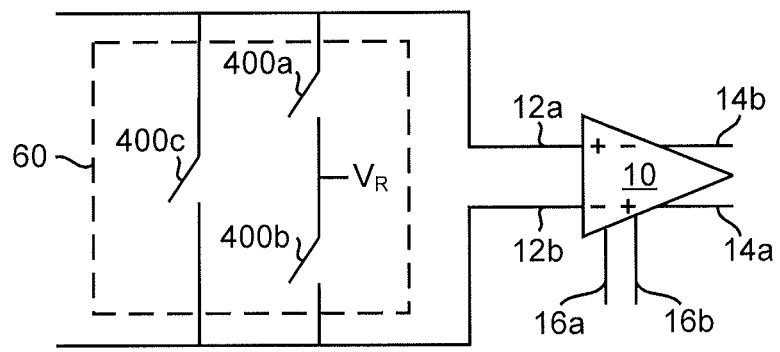

FIG. 7a and FIG. 7b show circuit diagrams of the auto-zero control unit 60 (FIG. 1 and FIG. 2) according to embodiments. In FIG. 7a and FIG. 7b, an exemplary connection to the main amplifier unit 10 (FIG. 1) is illustrated. The auto-zero control unit 60 may be connected in the same way between the input terminals 12a and 12b of the main amplifier unit 10b (FIG. 2).

In the embodiment illustrated in FIG. 7a, the auto-zero control unit 60 comprises two switch devices 400a and 400b arranged between a reference-voltage node having the reference voltage $V_R$ and the input terminals 12a and 12b of the main amplifier unit 10. The switch devices 400a and 400b are arranged to be closed during the auto-zero phase and open during the compare phase.

In the embodiment illustrated in FIG. 7b, the auto-zero control unit 60 additionally comprises a third switch device 400c connected between the input terminals 12a and 12b of the main amplifier unit 10. The switch device 400c is adapted to be closed during the auto-zero phase and open during the compare phase.

The switch devices 400a, 400b, and 400c may e.g. be implemented with NMOS transistors, PMOS transistors, or transmission gates.

As illustrated in FIG. 3 and FIG. 4, the main amplifier unit 10, 10b may comprise a current-source unit 160 for generating a bias current, or control current, to a differential control transistor pair (transistors 190a and 190b in FIG. 3 and FIG. 4), wherein the differential control transistor pair is arranged to receive the control current at a common node (i.e. the interconnected source nodes) of the control transistors 190a and 190b. According to other embodiments, e.g. with reference to FIG. 8 and FIG. 9, the main amplifier unit 10b and the regulator amplifier unit 30b may share a common bias current-source unit (e.g. current source unit 625 in FIG. 9), and the main amplifier unit 10b and the regulator amplifier unit 30b may be interconnected (not shown in FIG. 2) in such a way that the differential control transistor pair of the main amplifier unit 10b is arranged to receive the control current from the regulator amplifier unit 30b.

Figure 8:
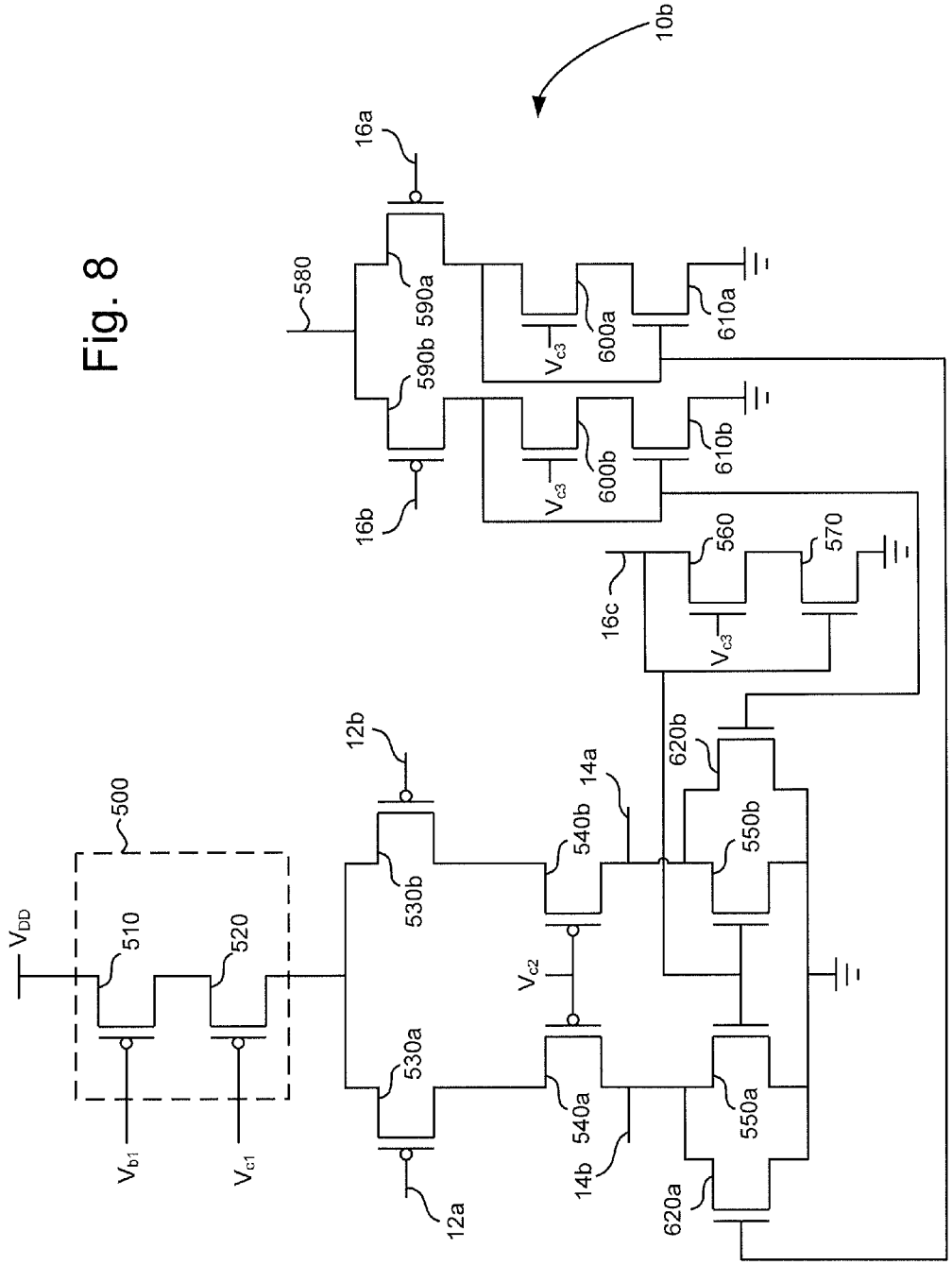
FIG. 8 is a circuit diagram of a main amplifier unit of a comparator circuit according to an embodiment.

FIG. 8 is a circuit diagram of an embodiment of the main amplifier unit 10b. According to the embodiment, the main amplifier unit 10b comprises a current-source unit 500 that comprises transistors 510 and 520. The current source unit 500, the transistor 510, and the transistor 520 correspond to the current-source unit 100, the transistor 110, and the transistor 120, respectively, of FIG. 4. Furthermore, according to the embodiment, the main amplifier unit 10b comprises a differential input transistor pair comprising the input transistors 530a and 530b. The transistors 530a and 530b correspond to the transistors 130a and 130b, respectively, of FIG. 4. Moreover, according to the embodiment, the main amplifier unit 10b comprises cascode transistors 540a and 540b that correspond to the cascode transistors 140a and 140b, respectively, of FIG. 4, and load transistors 550a and 550b that correspond to the load transistors 150a and 150b, respectively, of FIG. 4. The gate terminals of the load transistors 550a and 550b are connected to the gate terminal of a current-source input transistor 570 that corresponds to the current-source input transistor 210 of FIG. 4. As illustrated in FIG. 8, the main amplifier unit 10b may, according to the embodiment, comprise a cascode transistor 560 that corresponds to the cascode transistor 200 of FIG. 4.

Similar to the embodiment illustrated in FIG. 4, the embodiment of the main amplifier unit 10b illustrated in FIG. 8 comprises a differential control-transistor pair connected to a common node 580. The differential control transistor pair comprises control transistor 590a connected to the first control terminal 16a of the main amplifier unit 10b with its gate terminal. Furthermore, the differential control-transistor pair comprises a control transistor 590b connected to the second control terminal 16b of the main amplifier unit 10b with its gate terminal.

According to the embodiment illustrated in FIG. 8, the main amplifier unit 10b further comprises current-mirror input transistors 610a and 610b operatively connected to the control transistor 590a and 590b, respectively, for receiving currents therefrom. The current-mirror input transistor 610a is connected in a current-mirror configuration with an additional load transistor 620a connected in parallel with the load transistor 550a in the second branch of the main amplifier unit 10b. The current-mirror input transistor 610a and the load transistor 620a provides an operative connection between the input transistor 590a and the second branch of the main amplifier unit 10b. The current-mirror input transistor 610b is connected in a current-mirror configuration with an additional load transistor 620b connected in parallel with the load transistor 550b in the first branch of the main amplifier unit 10b. The current-mirror input transistor 610b and the load transistor 620b provides an operative connection between the input transistor 590b and the first branch of the main amplifier unit 10b.

According to the embodiment illustrated in FIG. 8, the main amplifier unit 10b comprises an NMOS cascode transistor 600a connected between the drain terminals of the transistors 590a and 610a and an NMOS cascode transistor 600b connected between the drain terminals of transistors 590b and 610b. According to some embodiments, one or both of the cascode transistors 600a and 600b may be omitted. For example, the drain terminals of the transistors 590a and 610a may be directly connected and/or the drain terminals of the transistors 590b and 610b may be directly connected.

By adjusting the drain currents of the control transistor 590a and 590b, e.g. by adjusting the differential voltage between the terminals 16a and 16b, the $V_{GS}$ of the load transistor 620a and the $V_{GS}$ of the load transistor 620b are adjusted. As a consequence, the drain currents of the load transistor 620a in the second branch and the load transistor 620b in the first branch are also adjusted. This, in turn, results in an adjustment of the differential output voltage between the terminals 14a and 14b. Hence, the offset-error voltage of the main amplifier unit 10b may be adjusted by adjusting the differential voltage between the terminals 16a and 16b, e.g. by means of an SC accumulator unit as in the embodiment illustrated in FIG. 2.

Figure 9:
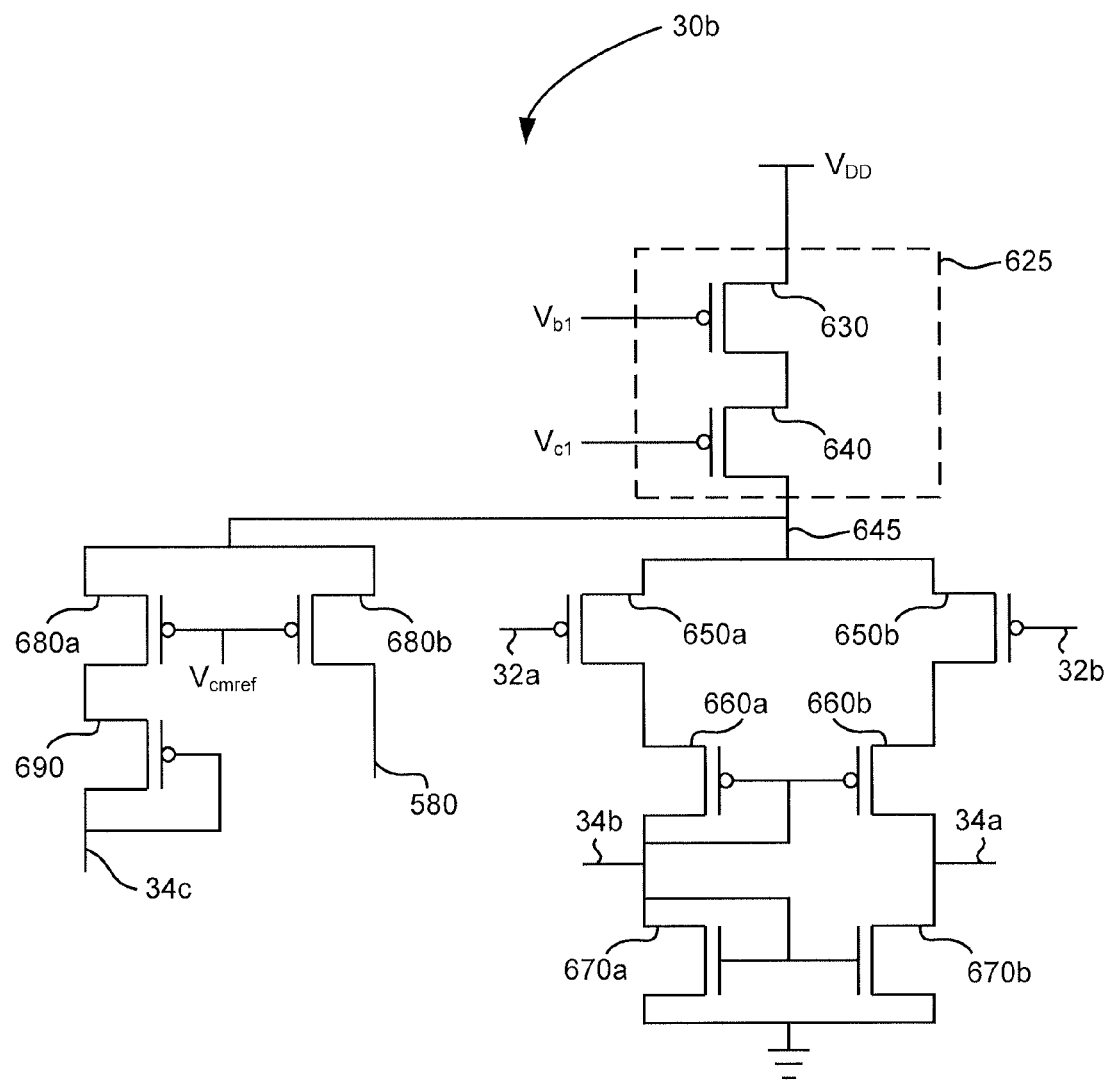
FIG. 9 is a circuit diagram of a regulator amplifier unit of a comparator circuit according to an embodiment.

FIG. 9 shows a circuit diagram of an embodiment of the regulator amplifier unit 30b according to an embodiment. The embodiment of the regulator amplifier unit 30b illustrated in FIG. 9 is suitable for operation together with the embodiment of the main amplifier unit 10b illustrated in FIG. 8. According to the embodiment, the regulator amplifier unit 30b comprises a current-source unit 625 that comprises transistors 630 and 640 and has an output terminal 645. The current source unit 625, the transistor 630, the transistor 640, and the output terminal 645 correspond to the current-source unit 300, the transistor 310, the transistor 320, and the output terminal 325, respectively, in FIG. 6. Furthermore, according to the embodiment, the regulator amplifier unit 30b comprises a differential transistor pair comprising transistors 650a and 650b, which correspond to transistors 330a and 330b, respectively, in FIG. 6, load transistors 670a and 670b, which correspond to the load transistors 350a and 350b, respectively, in FIG. 6, and cascode transistors 660a and 660b, which correspond to the cascode transistors 340a and 340b, respectively, in FIG. 6.

Similar to the embodiment illustrated in FIG. 6, the embodiment of the regulator amplifier unit 30b illustrated in FIG. 9 comprises a common-mode control transistor 680a, biased with the voltage $V_{cmref}$, operatively connected between the output terminal 645 of the current source unit 625 and the output terminal 34c of the regulator amplifier unit 30b for supplying the common-mode control current to the control terminal 16c of the main amplifier unit 10b. A diode-connected transistor 690 is connected between the common-mode control transistor 680a and the output terminal 34c. In some embodiments, the transistor 690 may be omitted.

In addition, the embodiment of the regulator amplifier unit 30b illustrated in FIG. 9 comprises a PMOS transistor 680b connected to the output terminal 645 of the current-source unit 625. The transistor 680b is arranged to be biased with the voltage $V_{cmref}$ at its gate terminal. Furthermore, it is operatively connected to the common node 580 of the differential control-transistor pair of the main amplifier unit 10b (FIG. 8) for supplying the control current to the differential control transistor pair.

According to the embodiment illustrated in FIG. 9, the transistor 660a is diode connected. Thereby, a suitable electrical gate potential may be obtained for the transistors 660a and 660b. According to some embodiments, the electrical gate potentials of the transistors 660a and 660b may be set by other means. As a nonlimiting example, the gate terminals of the transistors 660a and 660b may be connected to the gate terminal of the transistor 690.

According to an embodiment, all the transistors 680a, 680b, 650a, and 650b are designed to have the same size. Then, if the common-mode voltage at the input terminal 32a and 32b of the regulator amplifier unit 30 is approximately equal to $V_{cmref}$, approximately half the current generated by the current-source unit 625 is directed through the differential transistor pair comprising the transistors 650a and 650b, and approximately one fourth of the current generated by the current-source unit 625 is directed through each of the transistors 680a and 680b. According to other embodiments, one or more of the transistors 680a, 680b, 650a, and 650b may be differently sized than the others.

In the embodiments described so far, a fully differential SC accumulator unit is utilized for generating the control voltages to the control terminals 16a and 16b of the main amplifier unit 10, 10a. According to alternative embodiments, the SC accumulator unit may have a single-ended output. Furthermore, only one of the control terminals 16a and 16b may be needed. This may e.g. be accomplished by disconnecting the output terminal 34b of the regulator amplifier unit 30, 30b from the control terminal 16b of the main amplifier unit 10, 10b. The gate terminal of transistor 190a (FIGS. 3 and 4) or transistor 590b (FIG. 8) may instead be supplied e.g. with a DC voltage, supplied from an external source or internally in the main amplifier unit 10, 10b.

Furthermore, in the embodiments described above, bias currents of both branches of the main amplifier unit 10, 10b are adjusted in response to the control voltages supplied to the control terminals 16a and 16b of the main amplifier unit 10, 10b. According to alternative embodiments, only one branch is arranged to be affected by the control voltages supplied to the control terminals 16a and 16b. For example, with reference to FIGS. 3 and 4, the drain terminal of the transistor 190a may be disconnected from the drain terminal of the transistor 130a. Instead, a DC current may be injected into the node to which the drain terminal of the transistor 130a is connected. Furthermore, the drain terminal of the transistor 190a may be connected, e.g. via a dummy load element, to ground. Similarly, with reference to FIG. 8, the gate terminal of the transistor 610b may be disconnected from the gate terminal of the transistor 620b. Instead, a DC voltage may be supplied to the gate terminal of the transistor 620b.

Figure 10:
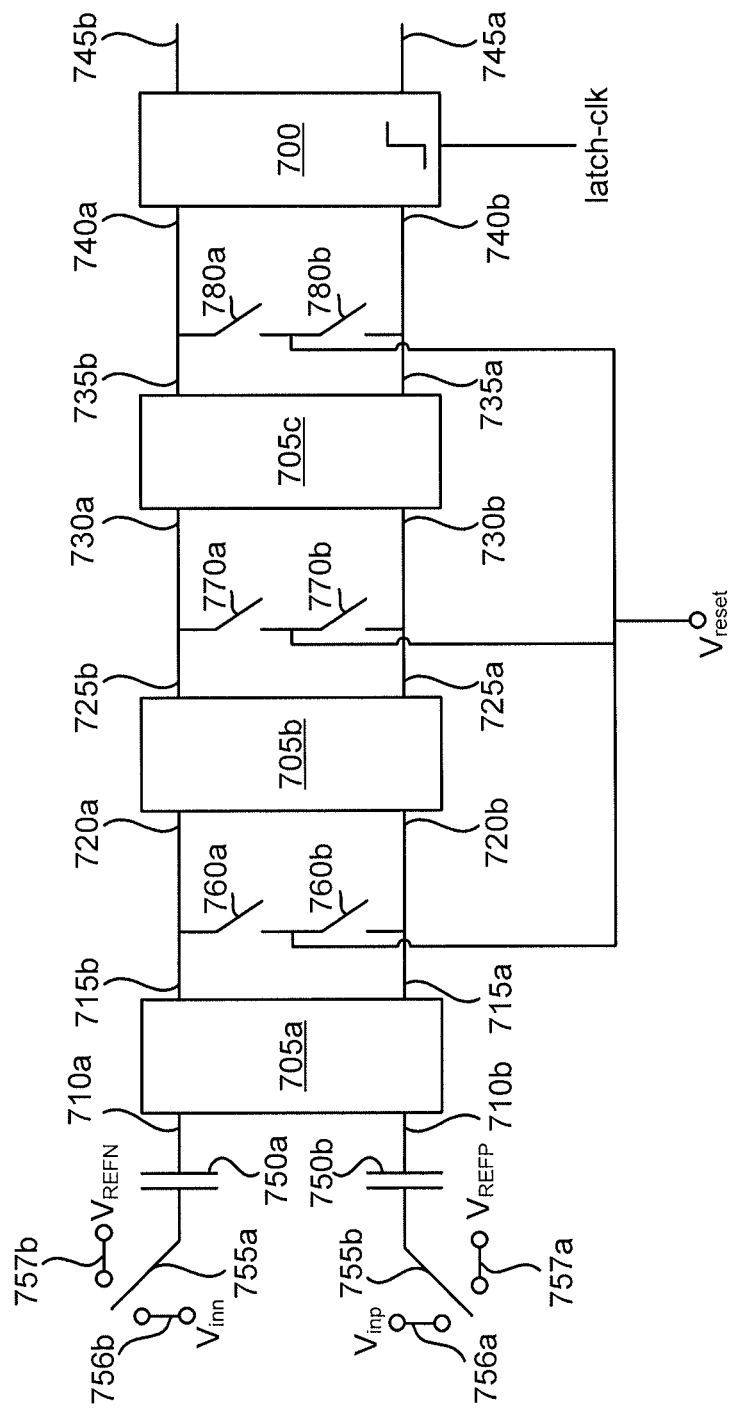
FIG. 10 is a circuit diagram of part of an analog-to-digital converter according to an embodiment.

FIG. 10 is a circuit diagram of part of an analog-to-digital converter (ADC) according to an embodiment. According to the embodiment, the ADC comprises a chain of comparator circuits connected in cascade followed by a latch circuit 700, which is clocked by a clock signal labelled latch_clk in FIG. 10. In the embodiment illustrated in FIG. 10, the latch circuit 700 is triggered by a rising edge of latch_clk. However, in other embodiments, the latch circuit 700 may be triggered by a falling edge of latch_clk.

In FIG. 10, the chain of comparator circuits comprises three comparator circuits 705a, 705b, and 705c. Each of the comparator circuits 705a, 705b, 705c may e.g. be implemented in accordance with any of the embodiments of the comparator circuit 5 (FIG. 1 and FIG. 2) described above. According to some embodiments, the chain of comparator circuits may comprise a number of comparator circuits other than three.

The positive and negative input terminals of the comparator circuit 705a are assigned reference numbers 710a and 710b, respectively, and the positive and negative output terminals of the comparator circuit 705a are assigned the reference numbers 715a and 715b, respectively. With reference to FIGS. 1 and 2, the positive input terminal 710a, negative input terminal 710b, positive output terminal 715a, and negative output terminal 715b are connected to a positive input terminal (12a in FIGS. 1 and 2), negative input terminal (12b in FIGS. 1 and 2), positive output terminal (14a in FIGS. 1 and 2), and negative output terminal (14b in FIGS. 1 and 2), respectively, of a main amplifier unit (10 in FIG. 1 or 10b in FIG. 2) comprised in the comparator circuit 705a.

Furthermore, the positive and negative input terminals of the comparator circuit 705b are assigned reference numbers 720a and 720b, respectively, and the positive and negative output terminals of the comparator circuit 705b are assigned the reference numbers 725a and 725b, respectively. With reference to FIGS. 1 and 2, the positive input terminal 720a, negative input terminal 720b, positive output terminal 725a, and negative output terminal 725b are connected to a positive input terminal (12a in FIGS. 1 and 2), negative input terminal (12b in FIGS. 1 and 2), positive output terminal (14a in FIGS. 1 and 2), and negative output terminal (14b in FIGS. 1 and 2), respectively, of a main amplifier unit (10 in FIG. 1 or 10b in FIG. 2) comprised in the comparator circuit 705b.

Moreover, the positive and negative input terminals of the comparator circuit 705c are assigned reference numbers 730a and 730b, respectively, and the positive and negative output terminals of the comparator circuit 705c are assigned the reference numbers 735a and 735b, respectively. With reference to FIGS. 1 and 2, the positive input terminal 730a, negative input terminal 730b, positive output terminal 735a, and negative output terminal 735b are connected to a positive input terminal (12a in FIGS. 1 and 2), negative input terminal (12b in FIGS. 1 and 2), positive output terminal (14a in FIGS. 1 and 2), and negative output terminal (14b in FIGS. 1 and 2), respectively, of a main amplifier unit (10 in FIG. 1 or 10b in FIG. 2) comprised in the comparator circuit 705c.

The latch circuit 700 has a positive input terminal 740a, a negative input terminal 740b, a positive output terminal 745a and a negative output terminal 745b. According to alternative embodiments, the latch circuit 700 may have a single-ended output instead. The latch circuit 700 is arranged to generate and hold, or latch, a result of a comparison performed in the ADC at its output terminals 745a and 745b, wherein the result either corresponds to a logic '0' or a logic '1' depending on an input to the chain of comparator circuits.

In FIG. 10, the positive input terminal 710a of the comparator circuit 705a is connected via a sampling capacitor 750a to a switch device 755a. Similarly, the negative input terminal 710b of the comparator circuit 705a is connected via a sampling capacitor 750b to a switch device 755b.

According to the embodiment illustrated in FIG. 10, the positive and negative output terminals 715a and 715b of the comparator circuit 705a are connected to the negative and positive input terminals 720b and 720a, respectively, of the comparator circuit 705b. Furthermore, the positive and negative output terminals 725a and 725b of the comparator circuit 705b are connected to the negative and positive input terminals 730b and 730a, respectively, of the comparator circuit 705c. Moreover, the positive and negative output terminals 735a and 735b of the comparator circuit 705c are connected to the negative and positive input terminals 740b and 740a, respectively, of the latch circuit 700.

According to an embodiment, the comparator circuit 705a comprises an auto-zero control unit 60 (not shown in FIG. 10), e.g. according one of to the embodiments illustrated in FIG. 7a and FIG. 7b, connected between the input terminals 710a and 710b of the comparator circuit 705a. According to some embodiments, the comparator circuits 705b and 705c does not have to comprise auto-zero control units 60 of the type illustrated in FIG. 7a or FIG. 7b. For example, during the auto-zero phase, the auto-zero control unit 60 of the comparator circuit 705a balances the voltages at the input terminals 710a and 710b of the comparator circuit 705a, e.g. by setting the voltages at said input terminals to be equal or approximately equal. Provided that the offset-error control loop of the comparator circuit 705a has controlled the offset-error voltage at the output terminals 715a and 715b of the comparator circuit 705b to settle around a relatively small value, the voltages at input terminals 720a and 720b of the comparator circuit 705b will also be balanced when the voltages at the input terminals 710a and 710b of the comparator circuit 705a are balanced. Hence, according to some embodiments, the comparator circuit 705a is arranged to balance the voltages at the positive and negative input terminals 720a and 720b of the comparator circuit 705b during the auto-zero phase. Similarly, according to some embodiments, the comparator circuits 705a and 705b are arranged to balance the voltages at the positive and negative input terminals 730a and 730b of the comparator circuit 705c during the auto-zero phase.

During the auto-zero phase, the switch device 755a may be set to connect the sampling capacitor 750a with a negative input terminal 756b of the ADC arranged to receive a negative input voltage $V_{inn}$ of the ADC. Similarly, the switch device 755b may be set to connect the sampling capacitor 750b with a positive input terminal 756a of the ADC arranged to receive a positive input voltage $V_{inp}$ of the ADC. When the auto-zero phase has ended and the balancing of the voltages at the input terminals 710a and 710b of the comparator circuit 705a has been released (e.g. switches 400a and 400b in FIG. 7a or switches 400a, 400b, and 400c in FIG. 7b have been opened), the switch devices 755a and 755b may be set to disconnect the sampling capacitors 750a and 750b from the input terminals 756b and 756a. Neglecting gate leakage in the input transistors of the main amplifier 10 (FIG. 1) or 10b (FIG. 2) of the comparator circuit 705a, the differential input voltage $V_{inp} - V_{inn}$ of the ADC is held by the sampling capacitors 750b and 750a in the form of a difference between the charges stored on the sampling capacitors 750b and 750a. Said charge difference is proportional to the differential input voltage.

During the compare phase, one or more comparisons between the differential input voltage $V_{inp}-V_{inn}$ and one or more reference voltages of the ADC may be performed. For that purpose, the switch devices 755a and 755b are set to connect the sampling capacitors 750a and 750b to reference voltage nodes 757b and 757a, respectively. In the embodiment illustrated, a differential reference voltage $V_{REFP}-V_{REFN}$ is used. In alternative embodiments, a single-ended reference voltage may be used, e.g. by setting $V_{REFN}$ in FIG. 10 to a constant value. Using a differential reference voltage, it may be beneficial if the common-mode level $(V_{REFP}+V_{REFN})/2$ of the reference voltage is approximately equal to the common-mode level $(V_{inp}+V_{inn})/2$ of the input voltage. Thereby, large common-mode variations at the input terminals 710a and 710b of the comparator circuit 705a may be avoided.

If the differential input voltage, $V_{inp}-V_{inn}$, is larger than the differential reference voltage, $V_{REFP}-V_{REFN}$, then the voltage at the positive input terminal 710a of the comparator circuit 705a will be larger than the voltage at the negative input terminal 710b of the comparator circuit 705a. On the other hand, if the differential input voltage, $V_{inp}-V_{inn}$, is smaller than the differential reference voltage, $V_{REFP}-V_{REFN}$, then the voltage at the positive input terminal 710a of the comparator circuit 705a will be smaller than the voltage at the negative input terminal 710b of the comparator circuit 705a. In either case, the voltage difference between the input terminals 710a and 710b of the comparator circuit is approximately equal to $(V_{inp}-V_{inn})-(V_{REFP}-V_{REFN})$.

According to an embodiment, wherein the ADC is an N-bit flash ADC, the ADC comprises $2^N$ instances of the circuit illustrated in FIG. 10 that operates on the same differential input voltage, but wherein each circuit instance operates on its own unique reference voltage. In this embodiment, a single comparison between the differential input voltage and the unique reference voltage is performed in each circuit instance during each compare phase. Flash ADCs are known in the art and further details thereof are not described herein.

According to another embodiment, wherein the ADC is an N-bit successive approximation ADC (SA ADC), the ADC comprises a single instance of the circuit illustrated in FIG. 10. In this embodiment, N comparisons between the differential input voltage and N different values of the differential reference voltage are performed during each compare phase. Reference voltages are supplied to the nodes 755a and 755b by a differential digital-to-analog converter (DAC, not show in FIG. 10), such as but not limited to a differential resistor-string DAC. The DAC is controlled by a digital control word stored in a successive-approximation register (SAR, not shown in FIG. 10) connected to a digital input port of the DAC. For a first comparison in a comparison phase, the most significant bit (MSB) of the digital control word is set to '1' and the remaining bits are set to '0'. In the first comparison, the value of the MSB of a digital output sample of the SA ADC is determined by means of the comparator circuits 705a, 705b, 705c, and the latch circuit 700. If it is determined that the differential input voltage is larger than the differential reference voltage supplied by the DAC, the MSB of the digital output sample is '1', otherwise the MSB of the digital output sample is '0'. The determined value of the MSB of the digital output sample is stored in the MSB position of the SAR and used as the MSB of the digital control word for the remaining N−1 comparisons performed during the compare phase. For a subsequent second comparison in the compare phase, the bit with second highest significance (MSB−1) of the digital control word is set to '1'. In the second comparison, the value of the MSB−1 of the digital output sample of the SA ADC is determined by means of the comparator circuits 705a, 705b, 705c, and the latch circuit 700. If it is determined that the differential input voltage is larger than the differential reference voltage supplied by the DAC, the MSB−1 of the digital output sample is '1', otherwise the MSB−1 of the digital output sample is '0'. The determined value of the MSB−1 of the digital output sample is stored in the MSB−1 position of the SAR and used as the MSB−1 of the digital control word for the remaining N−2 comparisons performed during the compare phase. The procedure is repeated until all N bits of the digital has been determined, whereby the digital output sample is stored in the SAR and available for output from the SA ADC. SA ADCs are known in the art, and further details thereof are not further described herein.

Comparator circuits according to embodiments of the present invention may also be employed in other types of ADCs, such as but not limited to, time-interleaved ADCs (TI ADCs), sigma-delta ADCs, parallel successive approximation ADCs (PSA ADCs), and pipelined ADCs.

To speed up the settling of the comparator circuits, reset switch devices 760a, 760b, 770a, 770b, 780a, and 780b may be connected to the output terminals 715b, 715a, 725b, 725a, 735b, and 735a, respectively, of the comparator circuits 705a, 705b, and 705c, as illustrated in FIG. 10. Each comparison performed in a comparison phase may be initialized by closing the reset switch devices 760a, 760b, 770a, 770b, 780a, and 780b. Thereby, results from a previous comparison are removed relatively quickly from the output terminals 760a, 760b, 770a, 770b, 780a, and 780b and the voltages at said terminals are set to values approximately equal to the voltage $V_{reset}$ indicated in FIG. 10. $V_{reset}$ may e.g. be equal or approximately equal to the common-mode reference voltage $V_{cmref}$ (FIGS. 6 and 9). According to an embodiment, a comparison is then continued by opening the reset switch devices 760a and 760b, thereby allowing a voltage difference to develop between the output terminals 715a and 715b of the comparator circuit 705 based on the differential input voltage of the ADC and the differential reference voltage. Thereafter, the reset switch devices 770a and 770b are opened, thereby allowing a voltage difference to develop between the output terminals 725a and 725b of the comparator circuit 705b based on the voltage difference at the input terminals 720a and 720b of the comparator circuit 705b. Subsequently, the reset switch devices 780a and 780b are opened, thereby allowing a voltage difference to develop between the output terminals 735a and 735b of the comparator circuit 705c based on the voltage difference at the input terminals 730a and 730b of the comparator circuit 705c. This is followed by a rising edge of latch_clk. In response thereto, the latch circuit 700 amplifies the voltage difference between its input terminals 740a and 740b to a voltage difference between its output terminals 745a and 745b corresponding to a logic '1' or logic '0', which is latched, or held, by the latch circuit 700 allowing the reset switch devices 760a, 760b, 770a, 770b, 780a, and 780b to be closed for initiating a subsequent comparison. Opening the reset switch devices 760a, 760b, 770a, 770b, 780a, and 780b in the order describe above makes it possible to avoid glitches at the output terminals 715b, 715a, 725b, 725a, 735b, and 735a of the comparator circuits 705a, 705b, and 705c.

The reset switch devices 760a, 760b, 770a, 770b, 780a, and 780b may e.g. be implemented with NMOS transistors, PMOS transistors, or transmission gates. The switch device 755a may e.g. be implemented with an NMOS transistor, a PMOS transistor, or a transmission gate connected between the capacitor 750a and the negative input terminal 756b, and an NMOS transistor, a PMOS transistor, or a transmission gate connected between the sampling capacitor 750a and the reference voltage node 755b. Similarly, the switch device 755b may e.g. be implemented with an NMOS transistor, a PMOS transistor, or a transmission gate connected between the capacitor 750b and the positive input terminal 756a, and an NMOS transistor, a PMOS transistor, or a transmission gate connected between the sampling capacitor 750b and the reference voltage node 755a.

It is an advantage of embodiments described herein that the capacitors 42a and 42b and the switch devices 50a and 50b (FIG. 1 and FIG. 2) can be made relatively small. Furthermore, it is possible to connect output terminals of a comparator circuit 5 according to embodiments described herein directly to input terminals of a subsequent comparator circuit, e.g. as illustrated with the comparator circuits 705a, 705b, and 705c in FIG. 10. Hence, compared with e.g. a comparator arrangement wherein auto zeroing is performed with switches connected between input and output terminals of a comparator circuit and wherein a chain of comparator circuits is connected with capacitors between the comparator circuits, the capacitive load of the comparator circuits may be significantly reduced with embodiments of the present invention. Thereby, the bandwidth of the comparator circuits can be improved. Furthermore, in present day submicron CMOS processes, transistors with different gate-oxide thicknesses may be provided. For example, PMOS and NMOS transistors may be provided in a "thin-oxide version" and a "thick-oxide version". In a comparator arrangement wherein a chain of comparator circuits are connected with capacitors between the comparator circuits, it may be necessary to use thick-oxide transistors as input transistors in the comparator circuits in order to avoid excessive charge leakage from said capacitors, due to a relatively high gate leakage in the thin-oxide transistors. However, as described above with reference to the embodiment illustrated in FIG. 10, it is possible to connect output terminals of a comparator circuit 5 according to embodiments described herein directly to input terminals of a subsequent comparator circuit. Since there are no capacitors connected between the comparator circuits, charge leakage from such capacitors is not a problem. Hence, thin-oxide transistors can be used as input transistors (e.g. transistors 130a-b in FIGS. 3 and 4, and transistors 530a-b in FIG. 8) in the comparator circuits. This is an advantage since the thin-oxide transistors are typically faster than their thick-oxide counterparts, also resulting in a bandwidth improvement for the comparator circuits. A possible exception in the embodiment of FIG. 10 is the comparator circuit 705a, wherein thick-oxide input transistors may be needed to avoid excessive charge leakage from the capacitors 750a and 750b.

Improving the bandwidth of the comparator circuits can in turn increase the maximum sampling frequency of an ADC comprising the comparator circuits. Hence, comparator circuits according to embodiments of the present invention are suitable for use in high-speed ADCs. As a nonlimiting application example, the comparator circuits may be suitable for use in video ADCs for sampling e.g. analog R (Red), G (Green), and B (Blue) signals input to e.g. a computer monitor or TV, such as a liquid crystal display (LCD) monitor or TV. In such applications, the required sampling frequency may be up to 270 MHz or even higher.

The minimum required size for the capacitors 42a and 42b and the switch devices 50a and 50b (FIGS. 1 and 2) may differ and may have to be considered individually for different applications and manufacturing technologies. Design considerations that may be relevant for determining said sizes, e.g. by means of simulations and/or measurements, are that if the capacitances of the capacitors 42a and 42b are decreased while every other circuit element is kept the same, then the loop gain of the control loop for controlling the output offset voltage of the comparator circuit 5 will be decreased, whereby the number of auto-zero phases required for settling the output offset voltage around a sufficiently small value will increase and the ability to compensate for drift in output offset voltage, e.g. due to temperature variations and/or 1/f noise will be reduced; and problems with charge injection from switches 50a, 50b, 52a, and 52b will increase.

Furthermore, the on resistance of the switch devices 50a and 50b should be low enough to ensure that the capacitors 42a and 42b are adequately charged during each auto-zero phase.

Comparator circuits according to embodiments of the present invention may be integrated on an integrated circuit (IC). As a nonlimiting example, the IC may comprise an ADC that in turn comprises one or more comparator circuits according to embodiments of the present invention.

Furthermore, an electronic apparatus may comprise one or more comparator circuits according to embodiments of the present invention. As a nonlimiting example, the electronic apparatus may comprise an ADC that in turn comprises one or more comparator circuits according to embodiments of the present invention. The electronic apparatus may e.g. be, but is not limited to, a television set, such as a stationary or hand-held television set, a liquid-crystal display, a computer monitor, a digital camera, a projector, e.g. such as a VGA projector or the like, or a radio receiver.

The present invention has been described above with reference to specific embodiments. However, other embodiments than the above described are possible within the scope of the invention. For example, one or more of the cascode transistors included in circuit diagrams shown in the drawings may be omitted in some embodiments. Alternatively or additionally, cascode transistors may be added in some embodiments. Moreover, complementary circuit solutions, where NMOS transistors are replaced with PMOS transistors, PMOS transistors are replaced with NMOS transistors, and connections to ground and supply voltage terminals are interchanged may be used in some embodiments. Furthermore, transistors other than MOS transistors, such as BJTs, may replace some of the transistors in the circuit diagrams included in the drawings. For example some NMOS transistors may be replaced with NPN transistors and/or some PMOS transistors may be replaced with PNP transistors. The different features of the invention may be combined in other combinations than those described. The scope of the invention is only limited by the appended patent claims.

The invention claimed is:

1. A comparator circuit, comprising:
 a fully differential main amplifier unit having a positive input terminal and a negative input terminal for receiving a differential input signal of the comparator circuit and a positive output terminal associated with a first branch of the main amplifier unit and a negative output terminal associated with a second branch of the main amplifier unit for outputting a differential output signal of the comparator circuit, the main amplifier unit comprising a control port adapted to control a bias current of the first branch of the main amplifier unit and/or a bias current of the second branch of the main amplifier unit in response to one or more control voltages supplied to the control port of the main amplifier unit;
 circuitry for balancing the voltages at the positive and negative input terminals of the main amplifier unit during a first clock phase of the comparator circuit; and a switched-capacitor accumulator unit with a differential input operatively connected to the positive and negative output terminals of the main amplifier unit for sampling voltages at the positive and negative output terminals of the main amplifier unit during the first clock phase, and operatively connected to the control port of the main amplifier unit for supplying said one or more control voltages;

wherein the control port of the main amplifier unit comprises a first control terminal and a second control terminal, and the switched-capacitor accumulator unit has a first output terminal operatively connected to the first control terminal of the main amplifier unit and a second output terminal operatively connected to the second control terminal of the main amplifier unit;

wherein the main amplifier unit comprises a differential input-transistor pair comprising a first input transistor in the second branch of the main amplifier unit connected to the positive input terminal of the main amplifier unit with its gate terminal and a second input transistor in the first branch of the main amplifier unit connected to the negative input terminal of the main amplifier unit with its gate terminal; and a differential control-transistor pair comprising a first control transistor connected to the first control terminal of the main amplifier unit with its gate terminal and operatively connected to one of the first and second branches of the main amplifier unit for controlling a bias current of the one of the first and the second branches of the main amplifier unit, and a second control transistor connected to the second control terminal of the main amplifier unit with its gate terminal and operatively connected to the other one of the first and second branches of the main amplifier unit for controlling a bias current of the other one of the first and the second branches of the main amplifier unit;

wherein the differential control-transistor pair is arranged to receive a control current at a common node of the first control transistor and the second control transistor;

wherein the switched capacitor accumulator unit comprises a regulator amplifier unit having a positive input terminal, a negative input terminal, a positive output terminal operatively connected to the first control terminal of the main amplifier unit, and a negative output terminal operatively connected to the second control terminal of the main amplifier unit;

a first capacitor operatively connected between the positive input terminal and the negative output terminal of the regulator amplifier unit;

a second capacitor operatively connected between the negative input terminal and the positive output terminal of the regulator amplifier unit;

a third capacitor operatively connected to a reference voltage node at a first terminal of the third capacitor;

a fourth capacitor operatively connected to the reference voltage node at a first terminal of the fourth capacitor;

a first switch device operatively connected between the positive output terminal of the main amplifier unit and a second terminal of the third capacitor;

a second switch device operatively connected between the negative output terminal of the main amplifier unit and a second terminal of the fourth capacitor;

a third switch device operatively connected between the positive input terminal of the regulator amplifier unit and the second terminal of the third capacitor;

a fourth switch device operatively connected between the negative input terminal of the regulator amplifier unit and the second terminal of the fourth capacitor;

wherein the first and second switch devices are arranged to be closed during the first clock phase and open during a second clock phase, wherein the first clock phase and the second clock phase do not overlap; and wherein the third and fourth switch devices are arranged to be closed during the second clock phase and open during the first clock phase.

2. The comparator circuit according to claim 1, wherein the main amplifier unit comprises:

a first load transistor in the second branch of the main amplifier unit;

a second load transistor in the first branch of the main amplifier unit;

a common-mode control terminal for receiving a common-mode control current for controlling a common-mode output voltage of the main amplifier unit; and a first current-mirror input transistor operatively connected to the common-mode control terminal for receiving the common-mode control current, and arranged in a current-minor configuration with the first and second load transistors of the main amplifier unit; and wherein the regulator amplifier unit comprises:

a current-source unit having an output terminal for outputting a current;

a common-mode control transistor operatively connected to the output terminal of the current-source unit, arranged to be biased with a common-mode reference voltage at its gate terminal, and operatively connected to the common-mode control terminal of the main amplifier unit for supplying the common-mode control current; and a differential transistor pair operatively connected to the output terminal of the current-source unit, wherein the differential transistor pair comprises a first input transistor in a first branch of the regulator amplifier unit and a second input transistor in a second branch of the regulator amplifier unit, and wherein the first input transistor is operatively connected to the positive input terminal of the regulator amplifier unit and the second input transistor is operatively connected to the negative input terminal of the regulator amplifier unit with their gate terminals.

3. The comparator circuit according to claim 2, wherein the regulator amplifier unit comprises:

a first load transistor in the first branch of the regulator amplifier unit; and a second load transistor in the second branch of the regulator amplifier unit;

wherein the gate terminals of the first and second load transistors are interconnected and one of the first and second load transistors is diode connected.

4. The comparator circuit according to claim 3, wherein the main amplifier unit comprises:

a current-source unit operatively connected to the common node of the differential control-transistor pair of the main amplifier unit for supplying the control current to the differential control-transistor pair of the main amplifier unit; and wherein the first control transistor of the differential control-transistor pair of the main amplifier unit is connected to the second branch of the main amplifier unit with its drain terminal; and the second control transistor of the differential control-transistor pair of the main amplifier unit is connected to the first branch of the main amplifier unit with its drain terminal.

5. The comparator circuit according to claim 3, wherein the regulator amplifier unit comprises:
a transistor operatively connected to the output terminal of the current-source unit of the regulator amplifier unit, arranged to be biased with the common-mode reference voltage at its gate terminal, and operatively connected to the common node of the differential control-transistor pair of the main amplifier unit for supplying the control current.

6. The comparator circuit according to claim 2, wherein the regulator amplifier unit comprises:
a transistor operatively connected to the output terminal of the current-source unit of the regulator amplifier unit, arranged to be biased with the common-mode reference voltage at its gate terminal, and operatively connected to the common node of the differential control-transistor pair of the main amplifier unit for supplying the control current.

7. The comparator circuit according to claim 6, wherein the main amplifier unit comprises:
a third load transistor in parallel with the first load transistor;
a fourth load transistor in parallel with the second load transistor;
a second current-mirror input transistor operatively connected to the drain terminal of the first control transistor of the differential control-transistor pair of the main amplifier unit, and arranged in a current-mirror configuration with the third load transistor of the main amplifier unit; and
a third current-mirror input transistor operatively connected to the drain terminal of the second control transistor of the differential control-transistor pair of the main amplifier unit, and arranged in a current-mirror configuration with the third load transistor of the main amplifier unit.

8. The comparator circuit according to claim 2, wherein the main amplifier unit comprises:
a current-source unit operatively connected to the common node of the differential control-transistor pair of the main amplifier unit for supplying the control current to the differential control-transistor pair of the main amplifier unit; and
wherein the first control transistor of the differential control-transistor pair of the main amplifier unit is connected to the second branch of the main amplifier unit with its drain terminal; and
the second control transistor of the differential control-transistor pair of the main amplifier unit is connected to the first branch of the main amplifier unit with its drain terminal.

9. The comparator circuit according to claim 1, wherein the regulator amplifier unit comprises:
a first load transistor in the first branch of the regulator amplifier unit; and
a second load transistor in the second branch of the regulator amplifier unit;
wherein the gate terminals of the first and second load transistors are interconnected and one of the first and second load transistors is diode connected.

10. The comparator circuit according to claim 9, wherein the main amplifier unit comprises:
a current-source unit operatively connected to the common node of the differential control-transistor pair of the main amplifier unit for supplying the control current to the differential control-transistor pair of the main amplifier unit; and
wherein the first control transistor of the differential control-transistor pair of the main amplifier unit is connected to the second branch of the main amplifier unit with its drain terminal; and
the second control transistor of the differential control-transistor pair of the main amplifier unit is connected to the first branch of the main amplifier unit with its drain terminal.

11. The comparator circuit according to claim 9, wherein the regulator amplifier unit comprises:
a transistor operatively connected to the output terminal of the current-source unit of the regulator amplifier unit, arranged to be biased with the common-mode reference voltage at its gate terminal, and operatively connected to the common node of the differential control-transistor pair of the main amplifier unit for supplying the control current.

12. The comparator circuit according to claim 11, wherein the main amplifier unit comprises:
a third load transistor in parallel with the first load transistor;
a fourth load transistor in parallel with the second load transistor;
a second current-mirror input transistor operatively connected to the drain terminal of the first control transistor of the differential control-transistor pair of the main amplifier unit, and arranged in a current-mirror configuration with the third load transistor of the main amplifier unit; and
a third current-mirror input transistor operatively connected to the drain terminal of the second control transistor of the differential control-transistor pair of the main amplifier unit, and arranged in a current-mirror configuration with the third load transistor of the main amplifier unit.

13. The comparator circuit according to claim 1, wherein the comparator circuit is included in an analog to digital converter.

14. The comparator circuit according to claim 1, wherein the comparator circuit is included in an integrated circuit.

15. The comparator circuit according to claim 1, wherein the comparator circuit is included in an electronic apparatus and the electronic apparatus is one of a television set, a liquid-crystal display, a computer monitor, a digital camera, a projector, and a radio receiver.

16. The comparator circuit according to claim 1, wherein the main amplifier unit comprises:
a current-source unit operatively connected to the common node of the differential control-transistor pair of the main amplifier unit for supplying the control current to the differential control-transistor pair of the main amplifier unit; and
wherein the first control transistor of the differential control-transistor pair of the main amplifier unit is connected to the second branch of the main amplifier unit with its drain terminal; and
the second control transistor of the differential control-transistor pair of the main amplifier unit is connected to the first branch of the main amplifier unit with its drain terminal.

* * * * *

UNITED STATES PATENT AND TRADEMARK OFFICE
CERTIFICATE OF CORRECTION

PATENT NO. : 8,610,465 B2
APPLICATION NO. : 12/993145
DATED : December 17, 2013
INVENTOR(S) : Jansson It is certified that error appears in the above-identified patent and that said Letters Patent is hereby corrected as shown below:

In the Specification

In Column 12, Line 29, delete "$V_{e4}$," and insert -- $V_{C4}$, --, therefor.

In Column 13, Line 25, in Eq. 1, delete "$I_{100}+I_{160}=(S_{150}/S_{210}.I_{300}$" and insert -- $I_{100}+I_{160}=(S_{150}/S_{210}).I_{300}$ --, therefor.

In the Claims

In Column 24, Lines 23-24, in Claim 2, delete "current-minor" and insert -- current-mirror --, therefor.

Signed and Sealed this
Thirteenth Day of May, 2014

Michelle K. Lee
*Deputy Director of the United States Patent and Trademark Office*